(12) United States Patent
Li

(10) Patent No.: US 10,541,374 B2
(45) Date of Patent: Jan. 21, 2020

(54) ELECTRONICALLY PURE SINGLE CHIRALITY SEMICONDUCTING SINGLE-WALLED CARBON NANOTUBE FOR LARGE SCALE ELECTRONIC DEVICES

(71) Applicant: Carbon Nanotube Technologies, LLC, Los Angeles, CA (US)

(72) Inventor: Huaping Li, Los Angeles, CA (US)

(73) Assignee: Carbon Nanotube Technologies, LLC, Los Angeles, CA (US)

( * ) Notice: Subject to any disclaimer, the term of this patent is extended or adjusted under 35 U.S.C. 154(b) by 366 days.

(21) Appl. No.: 15/290,575

(22) Filed: Oct. 11, 2016

(65) Prior Publication Data
US 2017/0194581 A1   Jul. 6, 2017

Related U.S. Application Data

(60) Provisional application No. 62/274,634, filed on Jan. 4, 2016.

(51) Int. Cl.
C09D 11/52 (2014.01)
C09D 11/037 (2014.01)
(Continued)

(52) U.S. Cl.
CPC .......... *H01L 51/0512* (2013.01); *C09D 11/52* (2013.01); *H01L 51/0004* (2013.01);
(Continued)

(58) Field of Classification Search
None
See application file for complete search history.

(56) References Cited

U.S. PATENT DOCUMENTS 6,682,863 B2   1/2004 Rivers et al.
6,919,681 B2   7/2005 Cok et al.
(Continued)

FOREIGN PATENT DOCUMENTS

CN   108885967 A   11/2018
GB   2562921 A   11/2018
(Continued)

OTHER PUBLICATIONS

Noh et al., "Ultra-thin polymer gate dielectrics for top-gate polymer field-effect transistors", Organic Electronics, 2009, Published Online Nov. 12, 2008, vol. 10, No. 1, pp. 174-180, doi: 10.1016/j.orgel.2008.10.021.

(Continued)

*Primary Examiner* — Helene Klemanski
(74) *Attorney, Agent, or Firm* — KPPB LLP

(57) ABSTRACT

An electronically pure carbon nanotube ink, includes a population of semiconducting carbon nanotubes suspended in a liquid, the ink being essentially free of metallic impurities and organic material, and characterized in that when incorporated as a carbon nanotube network in a metal/carbon nanotube network/metal double diode, a nonlinear current-bias curve is obtained on application of a potential from 0.01 V to 100 V. The ink can be used to prepare air-stable n-type thin film transistors having performances similar to current thin film transistors used in flat panel displays amorphous silicon devices and high performance p-type thin film transistors with high-κ dielectrics.

25 Claims, 25 Drawing Sheets

I. CNT TFT Etch-Stop (ES) Process Flow
1. Deposition and definition of metal gate (M1)
2. Sequential deposition of SiN gate dielectric, CNT, and SiN etch-stop layer
3. Definition of SiN etch stop pad (M2)
4. Deposition of n⁺
5. Definition of TFT island (M3)
6. Deposition and definition of metal S, D contacts (M4) and removal of n⁺
7. Deposition of final passivation layer and contact window opening to S, D, and G metals (M5)

(51) Int. Cl.
*H01L 51/00* (2006.01)
*H01L 51/05* (2006.01)

(52) U.S. Cl.
CPC ...... *H01L 51/0021* (2013.01); *H01L 51/0048* (2013.01); *H01L 51/0558* (2013.01); *H01L 51/0017* (2013.01); *H01L 51/0541* (2013.01); *H01L 51/0545* (2013.01)

(56) References Cited

U.S. PATENT DOCUMENTS

| | | |
|---|---|---|
| 7,253,041 B2 | 8/2007 | Gan et al. |
| 7,537,975 B2 | 5/2009 | Moon et al. |
| 7,907,226 B2 | 3/2011 | Yang et al. |
| 7,932,511 B2 | 4/2011 | Duan et al. |
| 8,232,561 B2 | 7/2012 | Rinzler et al. |
| 8,246,928 B1 * | 8/2012 | Rao .............. C09C 1/56 209/155 |
| 8,512,668 B2 * | 8/2013 | Tanaka ............ B82Y 30/00 423/447.1 |
| 8,715,607 B2 * | 5/2014 | Liu .............. B82Y 30/00 423/447.2 |
| 8,940,562 B1 | 1/2015 | Li |
| 9,070,775 B2 | 6/2015 | Chaji et al. |
| 9,445,421 B2 | 9/2016 | Levine et al. |
| 9,455,421 B2 | 9/2016 | Li |
| 9,487,002 B2 | 11/2016 | Rogers et al. |
| 9,748,439 B2 * | 8/2017 | Li ............... H01L 51/0005 |
| 2004/0252113 A1 | 12/2004 | Vicentini et al. |
| 2005/0221016 A1 * | 10/2005 | Glatkowski ........ B82Y 30/00 427/444 |
| 2006/0063460 A1 | 3/2006 | Seo |
| 2006/0081844 A1 | 4/2006 | Hirosue et al. |
| 2006/0145144 A1 | 7/2006 | Lee et al. |
| 2006/0261433 A1 | 11/2006 | Manohara et al. |
| 2007/0246784 A1 | 10/2007 | Kang et al. |
| 2008/0008643 A1 * | 1/2008 | Landi ............. B82Y 10/00 423/460 |
| 2008/0023066 A1 | 1/2008 | Hecht et al. |
| 2008/0286447 A1 | 11/2008 | Alden et al. |
| 2009/0008634 A1 | 1/2009 | Tessler et al. |
| 2010/0103089 A1 | 4/2010 | Yoshida et al. |
| 2010/0145062 A1 | 6/2010 | Li et al. |
| 2011/0012125 A1 | 1/2011 | Nicholas et al. |
| 2011/0036403 A1 | 2/2011 | Yoon et al. |
| 2011/0223095 A1 | 9/2011 | Harvey et al. |
| 2011/0285951 A1 | 11/2011 | Yoon et al. |
| 2012/0062109 A1 | 3/2012 | Berry et al. |
| 2012/0104328 A1 | 5/2012 | Park et al. |
| 2012/0256175 A1 | 10/2012 | Rinzler et al. |
| 2013/0069043 A1 | 3/2013 | Friend et al. |
| 2013/0105770 A1 | 5/2013 | Pschenitzka |
| 2013/0108793 A1 * | 5/2013 | Sivarajan ............ C09D 11/52 427/372.2 |
| 2015/0102288 A1 | 4/2015 | Hersam et al. |
| 2015/0155430 A1 | 6/2015 | Li |
| 2015/0202662 A1 * | 7/2015 | Li ............... H01L 51/0025 134/42 |
| 2015/0279919 A1 | 10/2015 | Zhou et al. |
| 2015/0340631 A1 | 11/2015 | Rinzler et al. |
| 2016/0043152 A1 | 2/2016 | Tian et al. |
| 2016/0126293 A1 | 5/2016 | Li et al. |
| 2016/0137854 A1 | 5/2016 | Heintz et al. |
| 2016/0280547 A1 * | 9/2016 | Liu .............. C01B 32/174 |
| 2016/0359144 A1 | 12/2016 | Li |
| 2017/0213963 A1 | 7/2017 | Cain et al. |
| 2018/0148337 A1 | 5/2018 | Walsh et al. |
| 2018/0323388 A1 | 11/2018 | Li |
| 2018/0323406 A1 | 11/2018 | Li |
| 2018/0358568 A1 | 12/2018 | Luan et al. |

FOREIGN PATENT DOCUMENTS

| | | |
|---|---|---|
| TW | 201734155 A | 10/2017 |
| WO | 2014208896 A1 | 12/2014 |
| WO | 2015077629 A1 | 5/2015 |
| WO | 2017096058 A1 | 6/2017 |
| WO | 2017120214 A1 | 7/2017 |
| WO | 2018208284 A1 | 11/2018 |

OTHER PUBLICATIONS

Nomura et al., "Room-temperature fabrication of transparent flexible thin-film transistors using amorphous oxide semiconductors", Nature, Nov. 25, 2004, vol. 432, pp. 488-492.

O'Connell et al., "Band gap fluorescence from individual single-walled carbon nanotubes", Science, Jul. 26, 2002, vol. 297, pp. 593-596.

Oh et al., "Vertical Type Organic Transistor Using C60 and its Application for OLET", Molecular Crystals and Liquid Crystals, Dec. 21, 2006, vol. 458, No. 1, pp. 247-254, doi: 10.1080/15421400600932439.

Panzer et al., "Low-voltage operation of a pentacene field-effect transistor with a polymer electrolyte gate dielectric", Applied Physics Letters, Feb. 28, 2005, vol. 86, pp. 103503-1-103503-3.

Park et al., "Enhanced luminescence in top-gate-type organic light-emitting transistors", Applied Physics Letters, Aug. 16, 2004, vol. 85, No. 7, pp. 1280-1282.

Park et al., "Flexible full color organic light emitting diode display on polyimide plastic substrate driven by amorphous indium gallium zinc oxide thin-film transistors", Applied Physics Letters, Jul. 6, 2009, vol. 95, No. 1, pp. 013503-1-013503-3, doi: 10.1063/1.3159832.

Park et al., "High-resolution electrohydrodynamic jet printing", Nature Materials, Oct. 2007, vol. 6, pp. 782-789, doi: 10.1038/nmat1974, published online Aug. 5, 2007.

Pei et al., "Polymer Light-Emitting Electrochemical Cells", Science, Aug. 25, 1995, vol. 269, No. 5227, pp. 1086-1088.

Perebeinos et al., "Schottky-to-Ohmic Crossover in Carbon Nanotube Transistor Contacts", Physical Review Letters, week ending Dec. 6, 2013, PRL 111, pp. 236802-1-236802-5, plus supplemental material.

Pivkina et al., "Nanomaterials for Heterogeneous Combustion", Propellants, Explosives, Pyrotechnics, Feb. 26, 2004, vol. 29, No. 1, pp. 39-48; DOI: 10.1002/prep.200400025.

Powell, "The Physics of Amorphous-Silicon Thin-Film Transistors", IEEE Transactions on Electron Devices, Dec. 1989, vol. 36, No. 12, pp. 2753-2763.

Rossi, "Two Decades of Research on Nano-Energetic Materials", Propellants Explos. Pyrotech., Jun. 11, 2014, vol. 39, pp. 323-327. DOI: 10.1002/prep.201480151.

Rouhi et al., "High performance semiconducting nanotube inks: progress and prospects", ACS Nano, Oct. 4, 2011, vol. 5, No. 11, 8471-8487, doi: 10.1021/nn201828y.

Rouhi et al., "Fundamental limits on the mobility of nanotube-based semiconducting inks", Advanced Materials, 2011, Published Online Oct. 26, 2010, vol. 23, pp. 94-99, doi: 10.1002/adma.201003281.

Rutherglen et al., "Nanotube electronics for radiofrequency applications", Nature Nanotechnology, Dec. 2009, vol. 4, pp. 811-819, published online Nov. 29, 2009.

Sabourin et al., "Functionalized Graphene Sheet Colloids for Enhanced Fuel/Propellant Combustion", ACS Nano, Nov. 19, 2009, vol. 3, No. 12, pp. 3945-3954, doi: 10.1021/nn901006w.

Schoppler et al., "Molar extinction coefficient of single-wall carbon nanotubes", Journal of Physical Chemistry C, Jun. 22, 2011, vol. 115, pp. 14682-14686, doi: 10.1021/jp205289h.

Seo et al., "Improved High-Efficiency Organic Solar Cells via Incorporation of a Conjugated Polyelectrolyte Interlayer", Journal of the American Chemical Society, May 10, 2011, vol. 133, pp. 8416-8419, doi: /10.1021/ja2037673.

Seo et al., "Improved Injection in n-Type Organic Transistors with Conjugated Polyelectrolytes", Journal of the American Chemical Society, Oct. 4, 2009, vol. 131, pp. 18220-18221.

Seo et al., "Solution-Processed Organic Light-Emitting Transistors Incorporating Conjugated Polyelectrolytes", Advanced Functional Materials, Jul. 18, 2011, vol. 21, pp. 3667-3672, doi: 10.1002/adfm.201100682.

(56) References Cited

OTHER PUBLICATIONS

Shao et al., "Long-lifetime polymer light-emitting electrochemical cells", Advanced Materials, 2007, vol. 19, pp. 365-370.
Shulaker et al., "Carbon nanotube computer", Nature, Sep. 26, 2013, vol. 501, pp. 526-530, doi: 10.1038/nature12502.
Sirringhaus et al., "Integrated Optoelectronic Devices Based on Conjugated Polymers", Science, Jun. 12, 1998, vol. 280, No. 5370, pp. 1741-1744, doi: 10.1126/science.280.5370.1741.
Slinker et al., "Direct measurement of the electric-field distribution in a light-emitting electrochemical cell", Nature Materials, Nov. 2007, Published Online Sep. 30, 2007, vol. 6, No. 11, pp. 894-899, doi: 10.1038/nmat2021.
Swensen et al., "Light emission from an ambipolar semiconducting polymer field-effect transistor", Applied Physics Letters, Dec. 15, 2005, vol. 87, pp. 253511-1-253511-3.
Sze et al., "Physics of Semiconductor Devices", Third Edition, Wiley, Toronto, 1985, 763 pgs. (presented in five parts).
Takahashi et al., "Carbon nanotube active-matrix backplanes for conformal electronics and sensors", Nano Letters, Nov. 3, 2011, vol. 11, pp. 5408-5413, doi: 10.1021/nl203117h.
Tang et al., "Organic electroluminescent diodes", Applied Physics Letters, Sep. 21, 1987, vol. 51, No. 12, pp. 913-915, doi: 10.1063/1.98799.
Tans et al., "Room-temperature transistor based on a single carbon nanotube", Nature, May 7, 1998, vol. 393, pp. 49-52.
Wang et al., "Wafer-scale fabrication of separated carbon nanotube thin-film transistors for display applications", Nano Letters, Sep. 30, 2009, vol. 9, No. 12, pp. 4285-4291, doi: 10.1021/nl902522f.
Wu et al., "Top-down patterning and self-assembly for regular arrays of semiconducting single-walled carbon nanotubes", Advanced Materials, Jul. 22, 2014, vol. 26, pp. 6151-6156, doi: 10.1002/adma.201401108.
Xia et al., "Printed Sub-2 V Gel-Electrolyte-Gated Polymer Transistors and Circuits", Advanced Functional Materials, Jan. 11, 2010, vol. 20, pp. 587-594, doi: 10.1002/adfm.200901845.
Xu et al., "Vertical organic light emitting transistor", Applied Physics Letters, Aug. 30, 2007, vol. 91, 092991-1-092991-3, doi: 10.1063/1.2778751.
Yamauchi et al., "Fabrication of Vertical Organic Light-Emitting Transistor Using ZnO Thin Film", Japanese Journal of Applied Physics, Apr. 24, 2007, vol. 46, No. 4B, pp. 2678-2682, doi: 10.1143/JJAP.46.2678.
Yan et al., "A high-mobility electron-transporting polymer for printed transistors", Nature, Jan. 21, 2009, vol. 457, doi: 10.1038/nature07727, 10 pgs.
Yang et al., "Control of Cationic Conjugated Polymer Performance in Light Emitting Diodes by Choice of Counterion", Journal of the American Chemical Society, May 27, 2006, vol. 128, pp. 14422-14423, doi: 10.1021/ja063723c.
Young, "When Can I Get My AMOLED TV", Information Display, 2010, vol. 10, pp. 24-29.
Zaumseil et al., "Spatial control of the recombination zone in an ambipolar light-emitting organic transistor", Nature materials, Jan. 2006, vol. 5, pp. 69-74.
Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, Jul. 23, 2014, vol. 6, pp. 12235-12244. doi: 10.1021/am501562m.
Zou et al., "Carbon nanotube driver circuit for 6×6 organic light emitting diode display", Scientific Reports, Jun. 29, 2015, vol. 5, No. 11755, pp. 1-9.
Definition of "form," Merriam WebsterrOnline, Retrieved from the Internet on Feb. 20, 2016.
International Preliminary Report on Patentability for International Application PCT/US2014/066926, Report issued May 24, 2016, dated Jun. 6, 2016, 12 Pgs.
International Preliminary Report on Patentability for International Application PCT/US2017/012161, Report issued Jul. 10, 2018, dated Jul. 19, 2018, 11 Pgs.

International Search Report and Written Opinion for International Application No. PCT/US2016/064449, Search completed Mar. 17, 2017, dated Apr. 4, 2017, 17 Pgs.
International Search Report and Written Opinion for International Application No. PCT/US2017/012161, Search completed Feb. 24, 2017, dated May 5, 2017, 38 Pgs.
International Search Report and Written Opinion for International Application No. PCT/US2017/031619, Search completed Jul. 11, 2017, dated Aug. 14, 2017, 15 Pgs.
International Search Report and Written Opinion for International Application PCT/US2014/066926, Report Completed Feb. 2, 2015, dated Mar. 3, 2015, 14 pgs.
"Global Flat Panel Displays Market to Reach US$110 Billion by 2017", Global Industry Analysts, Inc., Mar. 15, 2012, 3 pgs.
"Large AMOLED gets a cost edge over LCD", Sector Report Display, Korea Investment & Securities Co., Ltd. Aug. 16, 2011, 32 pgs.
"LCD TV Growth Improving, As Plasma and CRT TV Disappear", NPD DisplaySearch, Apr. 16, 2014, 2 pgs.
"Oxide TFT Production Forecast to Overtake LTPS in 2016", NPD DisplaySearch, Sep. 10, 2013, 4 pgs.
"Spin coating", Wkipedia, Oct. 23, 2015; Retrieved on Jul. 11, 2017, 2 pgs.
Almudever et al., "Variability and reliability of CNFET technology: impact of manufacturing imperfections", Microelectronics Reliability, Feb. 1, 2015, vol. 55, No. 2, pp. 358-366.
Aradhya et al., "Electrothermal Bonding of Carbon Nanotubes to Glass", Journal of the Electrochemical Society, Jul. 22, 2008, vol. 155, No. 9, pp. K161-K165.
Armstrong et al., "Enhanced Propellant Combustion with Nanoparticles", Nano Letters, Jan. 9, 2003, vol. 3, No. 2, pp. 253-255, doi: 10.1021/nl025905k.
Arnold et al., "Sorting carbon nanotubes by electric structure using density differentiation", Nature Nanotechnology, Oct. 2006, vol. 3, pp. 60-65.
Bachilo et al., "Structure-assigned optical spectra of single-walled carbon nanotubes", Science, Dec. 20, 2002, vol. 298, pp. 2361-2366, doi: 10.1126/science.1078727.
Ben-Sasson et al., "Patterned electrode vertical field effect transistor fabricated using block copolymer nanotemplates", Applied Physics Letters, Nov. 2009, vol. 95, pp. 213301-1-213301-3.
Bhat et al., "Electroluminescence in ion-gel gated conjugated polymer field-effect transistors", Chemistry of Materials, Oct. 7, 2012, vol. 24, pp. 4060-4067, doi: 10.1021/cm301610w.
Bonhommeau et al., "Raman spectroscopic investigation of individual single-walled carbon nanotubes helically wrapped by ionic, semiconducting polymers", Journal of Physical Chemistry C, Jun. 20, 2013, vol. 117, pp. 14840-14849, doi: 10.1021/jp4037606.
Braga et al., "High-Transconductance Organic Thin-Film Electrochemical Transistors for Driving Low-Voltage Red-Green-Blue Active Matrix Organic Light-Emitting Devices", Advanced Functional Materials, Feb. 14, 2012, vol. 22, pp. 1623-1631, doi: 10.1002/adfm.201102075.
Briseno et al., "Patterning Organic Single-Crystal Transistor Arrays", Nature, Dec. 14, 2006, vol. 444, pp. 913-917.
Bronikowski et al., "Gas-phase production of carbon single-walled nanotubes from carbon monoxide via the HiPco process: a parametric study", J Vac. Sci. Technol. A., May 2, 2001, vol. 19, pp. 1800-1805.
Brousseau et al., "Nanometric Aluminum in Explosives", Propellants, Explosives, Pyrotechnics, Feb. 27, 2002, vol. 27, pp. 300-306.
Cao et al., "Improved quantum efficiency for electroluminescence in semiconducting polymers", Nature, Feb. 4, 1999, vol. 397, pp. 414-417.
Cao et al., "Medium-scale carbon nanotube thin-film integrated circuits on flexible plastic substrate", Nature, Jul. 24, 2008, vol. 454, pp. 495-500.
Capelli et al., "Organic light-emitting transistors with an efficiency that outperforms the equivalent light-emitting diodes", Nature Materials, Jun. 2010, vol. 9, pp. 496-503, published online May 2, 2010.
Chaban et al., "Buckybomb: Reactive Molecular Dynamics Simulation", Journal of Physics Chemistry Letters, Feb. 24, 2015, vol. 6, pp. 913-917, DOI: 10.1021/ acs.jpclett.5b00120.

(56) References Cited

OTHER PUBLICATIONS

Chang et al., "Improved Electrical Performance of MILC Poly-Si TFTs Using CF4 Plasma by Etching Surface of Channel", IEEE Electron Device Letters, Feb. 2009, vol. 30, No. 2, pp. 130-132.
Cherenack et al., "Amorphous-silicon thin-film transistors fabricated at 300° C. on a free-standing foil substrate of clear plastic", IEEE Electron Device Letters, Nov. 2007, vol. 28, No. 11, pp. 1004-1006.
Chiang et al., "Purification and Characterization of Single-Wall Carbon Nanotubes (SWNTs) Obtained from the Gas-Phase Decomposition of CO (HiPco Process)", J. Phys. Chem. B, Aug. 10, 2001, vol. 105, pp. 8297-8301, doi:10.1021/jp0114891.
Cho et al., "Printable ion-gel gate dielectrics for low-voltage polymer thin-film transistors on plastic", Nature Materials, Nov. 2008, Published Online Oct. 19, 2008, vol. 7, pp. 900-906, doi: 10.1038/nmat2291.
Chortos et al., "Investigating Limiting Factors in Stretchable All-Carbon Transistors for Reliable Stretchable Electronics", ACS Nano, Jul. 26, 2017, vol. 11, pp. 7925-7937, doi: 10.1021/acsnano.7b02458.
Chortos et al., "Mechanically Durable and Highly Stretchable Transistors Employing Carbon Nanotube Semiconductor and Electrodes", Advanced Materials, 2016, Published Online Jul. 14, 2015, vol. 28, pp. 4441-4448, doi: 10.1002/adma.201501828.
Dai et al., "Solution-processed, high-performance light-emitting diodes based on quantum dots", Nature, Nov. 6, 2014, vol. 515, 96-99.
De Volder et al., "Carbon nanotubes: present and future commercial applications", Science, Feb. 1, 2013, vol. 339, pp. 535-539.
Dlott, "Thinking big (and small) about energetic materials", Materials Science and Technology, Apr. 2006, vol. 22, No. 4, pp. 463-473, doi:10.1179/174328406X83987.
Drandova et al., "SiN capacitors and ESD", CS Mantech Conference, Apr. 24-27, 2006, pp. 83-86.
Dreizin, "Metal-based reactive nanomaterials", Progress in Energy and Combustion Science, Apr. 2009, vol. 35, pp. 141-167, doi:10.1016/j.pecs.2008.09.001.
Dresselhaus et al., "Raman spectroscopy on isolated single wall carbon nanotubes", Carbon, 2002, vol. 40, pp. 2043-2061.
Friend et al., "Electroluminescence in conjugated polymers", Nature, Jan. 14, 1999, vol. 397, pp. 121-128.
Gao et al., "Complementary Logic Gate Arrays Based on Carbon Nanotube Network Transistors", Small, 2013, vol. 9, No. 6, pp. 813-819.
Ghosh et al., "Advanced sorting of single-walled carbon nanotubes by nonlinear density-gradient ultracentrifugation", Nature Nanotechnology, Jun. 2010, vol. 5, pp. 443-450.
Gu et al., "Design of flat panel displays based on organic light emitting devices", IEEE Journal of Selected Optics in Quantum Electronics, Jan./Feb. 1998, vol. 4, pp. 83-99.
Gundlach et al., "Pentacene Organic Thin-Film Transistors—Molecular Ordering and Mobility", IEEE Electron Device Letters, Mar. 1997, vol. 18, No. 3, pp. 87-89.
Ha et al., "Highly Uniform and Stable n-Type Carbon Nanotube Transistors by Using Positively Charged Silicon Nitride Thin Films", Nano Letters, 2015, vol. 15, pp. 392-397, published Dec. 1, 2014.
Hennrich et al., "Length-Sorted, Large-Diameter, Polyfluorene-Wrapped Semiconducting Single-Walled Carbon Nanotubes for High-Density, Short-Channel Transistors", ACS Nano, Jan. 2015, vol. 10, No. 2, pp. 1888-1895, doi: 10.1021/acsnano.5b05572.
Ho et al., "Molecular-scale interface engineering for polymer light-emitting diodes", Nature, Mar. 30, 2000, vol. 404, No. 6777, pp. 481-484.
Hone et al., "Thermal properties of carbon nanotubes and nanotube-based materials", Applied Physics A, Mar. 2002, vol. 74, pp. 339-343.
Hoven et al., "Electron injection into organic semiconductor devices from high work function cathodes", Proceedings of the National Academy of Sciences of the United States of America, Sep. 2, 2008, vol. 105, No. 35, pp. 12730-12735.
Hoven et al., "Ion motion in conjugated polyelectrolyte electron transporting layers", Journal of the American Chemical Society, Oct. 2007, vol. 129, No. 36, pp. 10976-10977, doi: 10.1021/ja072612q.
Hsu et al., "Control of Efficiency, Brightness, and Recombination Zone in Light0Emitting Field Effect Transistors", Advanced Materials, Jan. 25, 2012, vol. 24, pp. 1171-1175, doi: 10.1002/adma.201103513.
Iechi et al., "Vertical type organic light emitting device using thin-film ZnO electrode", Synthetic Metals, 2005, vol. 154, pp. 149-152.
Isert et al., "The effect of encapsulated nanosized catalysts on the combustion of composite solid propellants", Combustion and Flame, 2015, Published Online Dec. 23, 2014, vol. 162, pp. 1821-1828.
Javey et al., "Ballistic carbon nanotube field-effect transistors", Nature, Aug. 7, 2003, vol. 424 , pp. 654-657.
Javey et al., "High-K dielectrics for advanced carbon-nanotube transistors and logic gates", Nature Materials, Dec. 2002, vol. 1, pp. 241-245, published online Nov. 17, 2002.
Javey et al., "Self-aligned ballistic molecular transistors and electrically parallel nanotube arrays", Nano Letters, May 24, 2004, vol. 4, No. 7, pp. 1319-1322.
Keplinger et al., "Stretchable, Transparent, Ionic Conductors", Science, Aug. 30, 2013, vol. 341, No. 6149, pp. 984-987, doi: 10.1126/science.1240228.
Kim et al., "Electrical contacts to carbon nanotubes down to 1 nm in diameter", Applied Physics Letters, 2005, vol. 87, pp. 173101-1-173101-3.
Kim et al., "Polymer gate dielectric surface viscoelasticity modulates pentacene transistor performance", Science, Oct. 5, 2007, vol. 318, pp. 76-80.
Kimura et al., "Low- temperature polysilicon thin-film transistor driving with integrated driver for high resolution light emitting polymer display", IEEE Transactions on Electron Devices, Dec. 1999, vol. 46, Issue 12, pp. 2282-2288.
Kudo, "Organic light emitting transistors", Current Applied Physics, 2005, First Published Jun. 7, 2004, vol. 5, pp. 337-340, doi: 10.1016/j.cap.2003.11.095, 2005, 337-340.
Li et al., "Electronically Pure Single-Chirality Semiconducting Single-Walled Carbon Nanotube for Large-Scale Electronic Devices", ACS Applied Materials & Interfaces. Aug. 5, 2016. vol. 8, No. 32, pp. 20527-20533.
Li et al., "Molecular Design, Device Function and Surface Potential of Zwitterionic Electron Injection Layers", Journal of the American Chemical Society, Mar. 17, 2009, vol. 131, No. 25, pp. 8903-8912, doi: 10.1021/ja9018836.
Li et al., "Polyfluorinated electrolyte for fully printed carbon nanotube electronics", Advanced Functional Materials, Aug. 3, 2016, vol. 26, No. 38, pp. 6914-6920, doi: 10.1002/adfm.201601605.
Li et al., "Silicon nitride gate dielectric for top-gated carbon nanotube field effect transistors", Journal of Vacuum Science & Technology B 22, Nov./Dec. 2004, pp. 3112-3114.
Li et al., "The Effect of Interface States on Single-Walled Carbon Nanotube Transistors", ECS Journal of Solid State Science and Technology, Aug. 5, 2016, vol. 5, pp. M93-M98, doi: 10.1149/2.0271609jss.
Liang et al., "Elastomeric polymer light-emitting devices and displays", Nature Photonics, Oct. 2013, Published Online Sep. 22, 2013, vol. 7, pp. 817-824. doi: 10.1038/NPHOTON.2013.242.
Lin et al., "A novel LTPS-TFT pixel circuit compensating for TFT threshold-voltage shift and OLED degradation for AMOLED", IEEE Electron Device Letters, Feb. 2007, vol. 28, No. 2, pp. 129-131.
Lin et al., "Ambipolar-to-Unipolar Conversion of Carbon Nanotube Transistors by Gate Structure Engineering", Nano Letters, Mar. 12, 2004, vol. 4, No. 5, pp. 947-950.
Lin et al., "The Impact of Scaling-Down Oxide Thickness on Poly-Si Thin-Film Transistors' I-V Characteristics", IEEE electron device letters, Apr. 1994, vol. 15, No. 4, pp. 138-139.
Liu et al., "Large-scale single-chirality separation of single-walled carbon nanotubes by simple gel chromatography", Nature Communications, May 10, 2011, vol. 2, No. 309, pp. 1-8.

(56) References Cited

OTHER PUBLICATIONS

Logdlund et al., "Theoretical-studies of the interaction between aluminum and poly(pphenylenevinylene) and derivatives", The Journal of Chemical Physics, Sep. 1, 1994, vol. 101, pp. 4357-4364, doi: 10.1063/1.467486.

Maehashi et al., "Electrical characterization of carbon nanotube field-effect transistors with SiN x passivation films deposited by catalytic chemical vapor deposition", Applied Physics Letters, 2008, vol. 92, pp. 183111-1-183111-3; doi:10.1063/1.2920206.

Matyba et al., "The dynamic organic p-n junction", Nature Materials, Aug. 2009, Published Online Jun. 21, 2009, vol. 8, No. 8, pp. 672-676, doi: 10.1038/NMAT2478.

McCarthy et al., "Low-Voltage, Low-Power, Organic Light-Emitting Transistors for Active Matrix Displays", Science, Apr. 29, 2011, vol. 332, Issue 6029, pp. 570-573, doi: 10.1126/science.1203052.

Meda et al., "Nano-aluminum as energetic material for rocket propellants", Materials Science and Engineering C, Sep. 2007, vol. 27, Issues 5-8, pp. 1393-1396, doi: doi:10.1016/j.msec.2006.09.030.

Meda et al., "Nano-composites for rocket solid propellants", Composites Science and Technology, Apr. 2005, vol. 65, Issue 5, pp. 769-773.

Muccini, "A bright future for organic field-effect transistors", Nature Materials, Aug. 2006, vol. 5, No. 8, pp. 605-613.

Nakamura et al., "Improvement of Metal-Insulator-Semiconductor-Type Organic Light-Emitting Transistors", Japanese Journal of Applied Physics, Mar. 21, 2008, vol. 47, No. 3, pp. 1889-1893, doi: 10.1143/JJAP.47.1889.

"NSF Protocol P248 Military Operations Microbiological Water Purifiers", NSF International, Feb. 1, 2012, 2 pgs.

"Technical Bulletin Medical (TB MED) 577: Sanitary Control and Surveillance of Field Water Supplies", United States Department of the Army, 2013, 195 pgs.

Antaris et al., "Probing and Tailoring pH-Dependent Interactions between Block Copolymers and Single-Walled Carbon Nanotubes for Density Gradient Sorting", Journal of Physical Chemistry C, Aug. 28, 2012, vol. 116, No. 37, pp. 20103-20108, doi: 10.1021/jp3063564.

Brack et al., "Individual Soldier/Small Unit Desalination Device", Army SBIR Solicitation, Aug. 24-Oct. 24, 2018, Topic No. A18-149, 3 pgs.

Brady et al., "Quasi-ballistic carbon nanotube array transistors with current density exceeding Si and GaAs", Science Advances, Sep. 2, 2016, vol. 2, No. 9, pp. 1-9, e1601240, doi: 10.1126/sciadv.1601240.

Cao et al., "Fringing-field dielectrophoretic assembly of ultrahigh-density semiconducting nanotube arrays with a self-limited pitch", Nature Communications, Sep. 26, 2014, vol. 5, No. 5071, pp. 1-7, doi: 10.1038/ncomms6071.

Cao et al., "Radio Frequency Transistors Using Aligned Semiconducting Carbon Nanotubes with Current-Gain Cutoff Frequency and Maximum Oscillation Frequency Simultaneously Greater than 70 GHz", ACS Nano, Jun. 21, 2016, vol. 10, No. 7, pp. 6782-6790, doi: 10.1021/acsnano.6b02395.

Chen et al., "The Role of Metal-Nanotube Contact in the Performance of Carbon Nanotube Field-Effect Transistors", Nano Letters, Jun. 24, 2005, vol. 5, No. 7, pp. 1497-1502, doi: 10.1021/nl0508624.

Culp et al., "Electron Tomography Reveals Details of the Internal Microstructure of Desalination Membranes", PNAS, Aug. 28, 2018, vol. 115, No. 35, pp. 8694-8699, doi: 10.1073/pnas.1804708115.

Droudian et al., "Enhanced Chemical Separation by Freestanding CNT-Polyamide/Imide Nanofilm Synthesized at the Vapor-Liquid Interface", ACS Applied Materials & Interfaces, May 29, 2018, vol. 10, No. 23, pp. 19305-19310, doi: 10.1021/acsami.8b02329.

Hinds et al., "Aligned Multiwalled Carbon Nanotube Membranes", Science, Jan. 2, 2004, vol. 303, No. 5654, pp. 62-65, doi: 10.1126/science.1092048.

Holt et al., "Fast Mass Transport Through Sub-2-Nanometer Carbon Nanotubes", Science, May 19, 2006, vol. 312, No. 5776, pp. 1034-1037, doi: 10.1126/science.1126298.

Inukai et al., "High-Performance Multifunctional Reverse Osmosis Membranes Obtained by Carbon Nanotube Polyamide Nanocomposite", Scientific Reports, Sep. 3, 2015, vol. 5, No. 13562, pp. 1-10, doi: 10.1038/srep13562.

Joo et al., "Dose-Controlled, Floating Evaporative Self-assembly and Alignment of Semiconducting Carbon Nanotubes from Organic Solvents", Langmuir, Mar. 2, 2014, vol. 30, No. 12, pp. 3460-3466, doi: 10.1021/la500162x.

Kawai et al., "Self-formation of highly aligned metallic, semiconducting and single chiral single-walled carbon nanotubes assemblies via a crystal template method", Applied Physics Letters, Sep. 4, 2014, vol. 105, 093102, pp. 093102-1-093102-4, doi: 10.1063/1.4895103.

Kawai et al., "Single Chirality Extraction of Single-Wall Carbon Nanotubes for the Encapsulation of Organic Molecules", Journal of the American Chemical Society, 2012, vol. 134, No. 23, pp. 9545-9548, doi: 10.1021/ja3013853.

Krupke et al., "Contacting single bundles of carbon nanotubes with alternating electric fields", Applied Physics A, Jan. 31, 2002, vol. 76, No. 3, pp. 397-400, doi: 10.1007/s00339-002-1592-4.

Li et al., "Carbon Nanotube Transistor Operation at 2.6 GHz", Nano Letters, 2004, vol. 4, No. 4, pp. 753-756, doi: 10.1021/nl0498740.

Li et al., "Effects of Ambient Air and Temperature on Ionic Gel Gated Single-Walled Carbon Nanotube Thin-Film Transistor and Circuits", ACS Applied Materials & Interfaces, Sep. 29, 2015, vol. 7, No. 41, pp. 22881-22887, doi: 10.1021/acsami.5b05727.

Li et al., "Electrochemical Oxidations of p-Doped Semiconducting Single-Walled Carbon Nanotubes", Journal of Nanotechnology, Nov. 1, 2016, vol. 2016, No. 8073593, 8 pages, doi: 10.1155/2016/8073593.

Li et al., "Langmuir-Blodgett Assembly of Densely Aligned Single-Walled Carbon Nanotubes from Bulk Materials", Journal of the American Chemical Society, Feb. 15, 2007, vol. 129, No. 16, pp. 4890-4891, doi: 10.1021/ja071114e.

Li et al., "Transfer printing of submicrometer patterns of aligned carbon nanotubes onto functionalized electrodes", Small, Feb. 12, 2007, vol. 3, No. 4, pp. 616-621, doi: 10.1002/smll.200600525.

Li et al., "Visualizing Helical Wrapping of Semiconducting Single-Walled Carbon Nanotubes by Surfactants and Their Impacts on Electronic Properties", Chemistry Select, Aug. 3, 2016, vol. 1, No. 13, 5 pgs, doi: 10.1002/slct.201601033.

McGinnis et al., "Large-Scale Polymeric Carbon Nanotube Membranes with Sub-1.27-nm Pores", Science Advances, Mar. 9, 2018, vol. 4, No. e1700938, pp. 1-6, doi: 10.1126/sciadv.1700938.

Ortiz-Medina et al., "Robust Water Desalination Membranes Against Degradation Using High Loads of Carbon Nanotubes", Scientific Reports, Feb. 9, 2018, vol. 8, No. 2748, pp. 1-12, doi: 10.1038/s41598-018-21192-5.

Park et al., "High-density integration of carbon nanotubes via chemical self-assembly", Nature Nanotechnology, Oct. 28, 2012, vol. 7, pp. 787-791, doi: 10.1038/nnano.2012.189.

Park et al., "Large-Area Assembly of Densely Aligned Single-Walled Carbon Nanotubes Using Solution Shearing and Their Application to Field-Effect Transistors", Advanced Materials, Mar. 18, 2015, vol. 27, No. 16, pp. 2656-2662, doi: 10.1002/adma.201405289.

Seo et al., "Diameter Refinement of Semiconducting Arc Discharge Single-Walled Carbon Nanotubes via Density Gradient Ultracentrifugation", Journal of Physical Chemistry Letters, Aug. 7, 2013, vol. 4, No. 17, pp. 2805-2810, doi: 10.1021/jz4013596.

Shastry et al., "Large-Area, Electronically Monodisperse, Aligned Single-Walled Carbon Nanotube Thin Films Fabricated by Evaporation-Driven Self-Assembly", Small, Sep. 17, 2012, vol. 9, No. 1, pp. 45-51, doi: 10.1002/smll.201201398.

Takizawa et al., "Effective Antiscaling Performance of Reverse-Osmosis Membranes Made of Carbon Nanotubes and Polyamide Nanocomposites", ACS Omega, Jun. 5, 2018, vol. 3, No. 6, pp. 6047-6055, doi: 10.1021/acsomega.8b00601.

Tang et al., "Enhanced Flux and Electrochemical Cleaning of Silicate Scaling on Carbon Nanotube-Coated Membrane Distilla-

(56) References Cited

OTHER PUBLICATIONS tion Membranes Treating Geothermal Brines", ACS Applied Materials & Interfaces, Oct. 13, 2017, vol. 9, No. 44, pp. 38594-38605, doi: 10.1021/acsami.7b12615.
Treacy et al., "Exceptionally High Young's Modulus Observed for Individual Carbon Nanotubes", Nature, Jun. 20, 1996, vol. 381, pp. 678-680, doi: 10.1038/381678a0.
Tunuguntla et al., "Enhanced Water Permability and Tunable Ion Selectivity in Subnanometer Carbon Nanotube Porins", Science, Aug. 25, 2017, vol. 357, No. 6353, pp. 792-796, doi: 10.1126/science.aan2438.
Wang et al., "Ultrahigh Frequency Carbon Nanotube Transistor Based on a Single Nanotube", IEEE Transactions on Nanotechnology, Jul. 9, 2007, vol. 6, No. 4, pp. 400-403, doi: 10.1109/TNANO.2007.901179.
Wu et al., "Self-Assembly of Semiconducting Single-Walled Carbon Nanotubes into Dense, Aligned Rafts", Small, Jul. 11, 2013, vol. 9, No. 24, pp. 1-28, doi: 10.1002/smll.201301547.
Yu et al., "Microwave nanotube transistor operation at high bias", Applied Physics Letters, Jun. 8, 2006, vol. 88, 233115, pp. 233115-1-233115-3, doi: 10.1063/1.2210447.
International Preliminary Report on Patentability for International Application No. PCT/US2017/031619, Report issued Nov. 12, 2019, dated Nov. 21, 2019, 8 pages.

\* cited by examiner

Fig. 14

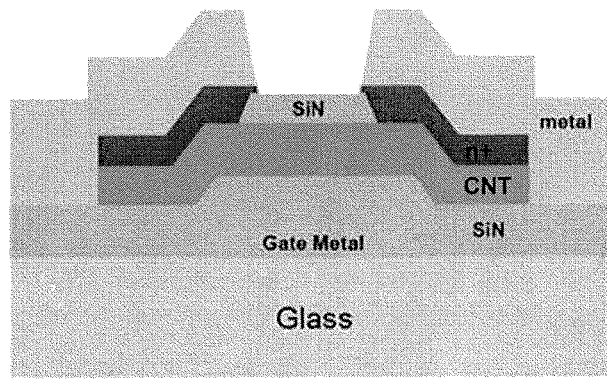

I. CNT TFT Etch-Stop (ES) Process Flow
1. Deposition and definition of metal gate (M1)
2. Sequential deposition of SiN gate dielectric, CNT, and SiN etch-stop layer
3. Definition of SiN etch stop pad (M2)
4. Deposition of n⁺
5. Definition of TFT island (M3)
6. Deposition and definition of metal S, D contacts (M4) and removal of n⁺
7. Deposition of final passivation layer and contact window opening to S, D, and G metals (M5)

Fig. 15

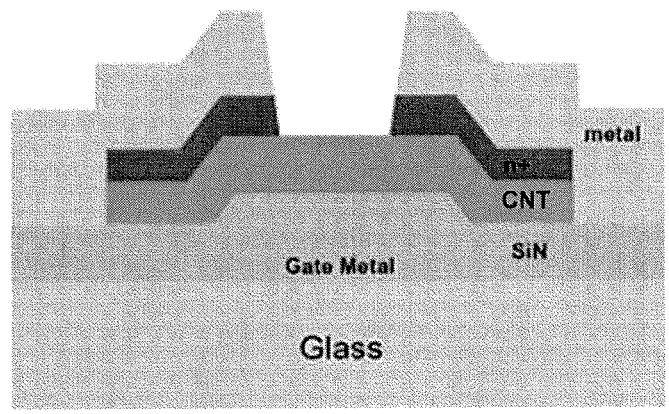

II. CNT TFT Back-Channel Etch (BCE) Process Flow
1. Deposition and definition of metal gate (M1)
2. Sequential deposition of SiN gate dielectric, CNT, and n⁺
3. Definition of CNT TFT island (M2)
4. Deposition and definition of metal S, D contacts (M3)
5. Etch back of exposed n⁺ (over-etch to ensure clearance)
6. Deposition of final passivation layer and contact window opening to S, D, and G metals (M4)

ELECTRONICALLY PURE SINGLE CHIRALITY SEMICONDUCTING SINGLE-WALLED CARBON NANOTUBE FOR LARGE SCALE ELECTRONIC DEVICES

CROSS-REFERENCE(S) TO RELATED APPLICATIONS

The present application claims the benefit of U.S. Patent Application No. 62/274,634, filed on Jan. 4, 2016, the content of which is hereby incorporated by reference herein in its entirety.

INCORPORATION BY REFERENCE

All patents, patent applications and publications cited herein are hereby incorporated by reference in their entirety in order to more fully describe the state of the art as known to those skilled therein as of the date of the invention described herein

TECHNICAL FIELD

This technology relates generally to high purity single-walled carbon nanotubes (SWCNTs). In particular, this invention relates to the use of SWCNTs in electronic devices.

BACKGROUND

Single-walled carbon nanotubes (SWCNTs) have been attracting researchers' attention for potential applications as field emission transistors for electronic devices, computers and thin film transistor backplanes. The mixed nature of SWCNTs growth, however, has impeded their implementation. One reason if the unavailability of high purity, single chirality SWCNTs. Current methods of purifying SWCNTs rely on optical spectroscopic screening techniques that have proven unable to accurately establish CNT purity. Devices using semiconducting SWCNTs deemed 'pure' by optical screening methods ubiquitously show linear current-to-bias ("I-V") responses, violating semiconductor characteristics of metal/semiconductor Schottky contacts and illustrating the presence of metal impurities and metallic SWCNTs.

Semiconducting single-walled carbon nanotubes have demonstrated the ability to be used in place of high performance silicon transistors for applications in microprocessor and radio frequency devices. Semiconducting single-walled carbon nanotube (SWCNT) thin film transistors (TFTs) also exhibit promise for large size display backplanes. The majority of SWCNT TFTs were bottom gated with $SiO_2$ or $Al_2O_3$. The device performance on these bottom gated SWCNT FETs were unstable and degraded after certain time, requiring polymer encapsulation or inorganic thin film passivation. In contrast, top-gated SWCNT TFTs are stable and promising for real applications. A few top gated SWCNT TFTs have been reported using dielectric materials such as $HfO_2$, $Al_2O_3$, $ZrO_2$, and $Y_2O_3$ deposited using electron beam evaporation or atomic layer deposition. The dielectric materials of these successful devices were all deposited at low temperature (<150° C.).

Recently, the SiNx commonly used for amorphous silicon TFTs was adapted to be used as dielectrics for SWCNTs TFTs. Silicon nitride gate dielectrics for top-gated carbon nanotube field effect transistors showing p-type characteristics were obtained using plasma enhanced chemical vapor deposition (PECVD) at 225° C. Both n-type and p-type characteristics of SWCNTs transistors with SiNx passivation films or top-gated insulators have been observed based on different deposition temperatures using catalytic chemical vapor deposition. At deposition temperatures higher than 330° C., SWCNTs were destroyed. At a deposition temperature around 270° C., the fabricated transistors were converted from p-type to n-type characteristics. This was interpreted as due to the removal of the adsorbed oxygen. At deposition temperatures between 60° C. and 120° C., the carbon nanotube transistors retained their original p-type properties. Stable n-type SWCNTs TFTs have also been obtained by annealing the devices with a $Si_3N_4$ layer deposited in a plasma-enhanced chemical vapor deposition system at 110° C. in nitrogen atmosphere at 200° C. for one hour, or by using PECVD directly deposited $Si_3N_4$ as dielectrics. More recently, $SiO_2$ bottom gated n-type SWCNTs TFTs having SiNx passivation deposited at 150° C. using PECVD were reported. No damage was induced using PECVD at 150° C., and the obtained n-type characteristics were attributed to the doping of SWCNT by SiNx K (Si≡N⁺) centers, which sufficiently thinned the Schottky Barrier (SB) to the conduction band to allow for efficient electron tunneling from the contacts into nanotubes. The effects of metal/SWCNT contacts were attributed to the wettability of metals to carbon nanotubes.

Schottky barriers occur when the semiconductors contact with the metals. Evidence of Schottky barriers was observed as inflection points in output characteristics of semiconducting carbon nanotube field effect transistors. The linear conductances at low drain bias in the output characteristics of SWCNT FETs with Schottky barriers have been attributed to the tunneling effects, and the on-conductances ($4e^2/h$) are used to determine Schottky barriers of SWCNT TFTs. Thus SWCNT TFTs have been considered Schottky Barrier transistors for the modulation of the contact resistances, with the exclusive focus on transmission through the barrier by thinning the barrier and increasing the tunneling. These theoretical explanations were based on back-gated $SiO_2$ dielectrics that are purer and more defect free than silicon nitride dielectrics.

Although advances in SWCNT TFT performance has made some progress, devices with performances rivaling those of amorphous silicon based devices has been hampered by the quality of the available SWCNTs.

SUMMARY

In one aspect, electronically pure, semiconducting carbon nanotube ("e-CNT") are provided. In particular, electronically pure, semiconducting single-walled carbon nanotube ("e-SWCNT") inks are provided.

In one aspect, an electronically pure carbon nanotube ink includes a population of single-walled semiconducting carbon nanotubes suspended in a liquid, the ink being essentially free of metallic impurities and characterized in that when incorporated as a carbon nanotube network in a metal/carbon nanotube network/metal double diode, a non-linear current-bias curve is obtained on application of a potential from 0.01 V to 5 V.

In one or more embodiments, 99.9% or more or 99.99% or more of the carbon nanotubes are semiconducting.

In one or more embodiments, the carbon nanotubes comprise one or more chiralities selected from (6,1), (5,3), (7,0), (6,2), (5,4), (8,0), (7,2), (8,1), (6,4), (7,3), (6,5), (9,1), (8,3), (10,0), (9,2), (7,5), (8,4), (11,0), (12, 2), (7,6), (9,4), (11,1), (10,3), (8,6), (9,5), (12,1), (11,3), (8,7), (13,0), (12,2), (10,5), (11,4), (9,7), (10,6), (13,2), (12,4), (14,1), (9,8), (13,3), (18,4), (20,2).

In one or more embodiments, the semiconducting carbon nanotubes are of a single chirality, and can be (6,5) single-walled carbon nanotubes.

In one or more embodiments, the semiconducting carbon nanotubes are a single tube diameter of 0.7 nm and length from 500 nm to 10 μm.

In one or more embodiments, the liquid comprises deionized water, and can further include water soluble surfactants, such as for example, water soluble surfactants selected from the group of are sodium dodecyl sulfate, sodium dodecylbenzene sulfate, sodium cholate, and sodium deoxycholate.

In another aspect, an electronically pure carbon nanotube thin film includes a population of single-walled semiconducting carbon nanotubes essentially free of metallic impurities and organic material, and characterized in that when incorporated as a carbon nanotube network in a metal/carbon nanotube network/metal double diode, a nonlinear current-bias curve is obtained on application of a potential from 0.01 V to 5 V.

In one or more embodiments, the semiconducting carbon nanotubes are a single tube diameter of 0.7 nm and length from 500 nm to 5 μm.

In one or more embodiments, the carbon nanotube density is in a range from 1-1000 nanotubes per μm².

In another aspect, the carbon nanotube film can be used to identify an electronically pure carbon nanotube ink by providing a nanotube ink of interest; preparing a metal electrode/carbon nanotube network/metal electrode double diode, using the carbon nanotube ink of interest; applying a voltage from 0.01 V to 5 V across the metal electrodes of the diode; and generating a current-bias curve, wherein a nonlinear curve is an indication of an electronically pure semiconducting carbon nanotube ink.

In one or more embodiments, the nonlinear curve exhibits a power-law behavior.

In one or more embodiments, the electrodes are prepared from metals selected from Au, Cr, Ag, Ti, Cu, Al, Mo, Pd, Pt, Sc, and/or their combination.

In one or more embodiments, the electrodes define a channel length in the range of 5 nm to ≥1 mm and a channel width in the range of 5 nm to ≥1 mm.

In another aspect, a method of making an electronically pure carbon nanotube thin film includes treating a substrate by ozone, and coating with poly(l-Lysine); and applying an electronically pure semiconducting carbon nanotube ink on the on poly(l-Lysine) treated substrate.

In another aspect, an n-type carbon nanotube thin film transistors includes an electronically pure semiconducting carbon nanotube thin film; drain/source metal electrodes in electrical contact with the carbon nanotube thin film; an amorphous silicon nitride dielectrics layer; and a metal gate electrode, characterized in that the N-type carbon nanotube thin film transistor shows amorphous silicon-like transfer characteristics in which the current increases from <$10^{-12}$ A to at least $10^{-7}$ A when the gate voltage sweeps from 0 V to 20V under 0.1 V drain-source bias.

In one or more embodiments, the n-type carbon nanotube thin film transistor is characterized in that under $V_{DS}$=0.1 V, the $I_{DS}$ increases from 1 fA at −5V to 0.1 μA at 30 V.

In one or more embodiments, the carbon nanotube density is in a range from 1-1000 nanotubes per μm².

In one or more embodiments, the n-type carbon nanotube thin film transistor is characterized in that under $V_{DS}$=10 V, $I_{DS}$>30 μA at 30 V.

In one or more embodiments, the thin film transistor demonstrates negligible threshold shift after 10 V stress for one hour.

In one or more embodiments, the n-type carbon nanotube thin film transistor is characterized in that under $V_{DS}$=0.1 V, the $I_{ON}/I_{OFF}$ ratio is >$10^8$.

In one or more embodiments, the n-type carbon nanotube thin film transistor is characterized in that under $V_{DS}$=0.1 V, the $I_{ON}/I_{OFF}$ ratio is in the range of $10^6$-$10^{12}$.

In one or more embodiments, the gate electrode is a top gate electrode.

In one or more embodiments, the gate electrode is a bottom gate electrode.

In one or more embodiments, the thin film transistor is prepared using an etch-stop process.

In one or more embodiments, the thin film transistor is prepared using a back channel etch process.

In one or more embodiments, the thin film transistor is air stable.

In one or more embodiments, the n-type carbon nanotube thin film transistors have channel lengths ranging from 5 nm to 1 mm or higher.

In one or more embodiments, the n-type carbon nanotube thin film transistors have channel widths ranging from 5 nm to 1 mm.

In one or more embodiments, the carbon nanotubes comprise one or more chiralities selected from (6,1), (5,3), (7,0), (6,2), (5,4), (8,0), (7,2), (8,1), (6,4), (7,3), (6,5), (9,1), (8,3), (10,0), (9,2), (7,5), (8,4), (11,0), (12, 2), (7,6), (9,4), (11,1), (10,3), (8,6), (9,5), (12,1), (11,3), (8,7), (13,0), (12,2), (10,5), (11,4), (9,7), (10,6), (13,2), (12,4), (14,1), (9,8), (13,3), (18,4), (20,2), such as semiconducting carbon nanotubes of a single chirality, and can be for example, (6,5) single-walled carbon nanotube.

In one aspect, the semiconducting carbon nanotubes are a single tube dimension.

In another aspect, a p-type carbon nanotube thin film transistors includes electronically pure semiconducting carbon nanotube thin film; drain/source metal electrodes in electrical contact with the carbon nanotube thin film; a hafnium oxide dielectrics layer; a metal gate electrode, characterized in that the p-type carbon nanotube thin film transistors show p-type transfer characteristics, in which under $V_{DS}$=1 V, the $I_{DS}$ increases from <$10^{-12}$ A to at least $10^{-7}$ A when the gate voltage sweeps from 0 V to −20V under 1 V drain-source bias In one or more embodiments, the p-type carbon nanotube thin film transistors is characterized in that the p-type carbon nanotube thin film transistors show p-type transfer characteristics, in which under $V_{DS}$=1 V, the $I_{DS}$ increases less than 1 fA at 5V to 0.1 μA at −15 V.

In one or more embodiments, the carbon nanotube density is in a range from 1-1000 nanotubes per μm².

In one or more embodiments, the p-type carbon nanotube thin film transistors is characterized in that under $V_{DS}$=1 V, the $I_{ON}/I_{OFF}$ ratio is >$10^8$.

In one or more embodiments, the p-type carbon nanotube thin film transistors is characterized in that under $V_{DS}$=1 V, the $I_{ON}/I_{OFF}$ ratio is in the range of $10^6$-$10^{12}$.

In one or more embodiments, wherein the thin film transistor is air stable.

In one or more embodiments, the p-type carbon nanotube thin film transistors have channel lengths ranging from 35 nm to 1 mm or higher.

In one or more embodiments, the p-type carbon nanotube thin film transistors have channel widths ranging from 5 nm to 1 mm.

The performances of top-gated (6,5) SWCNT thin film transistors (TFTs) are consistent and reproducible, remarkably different from those constructed on optically pure semiconducting SWCNTs. The stable and invariant device performances of (6,5) SWCNT can be ascribed to their uniform diameter and chirality. TFT fabrication processes compatible with conventional amorphous silicon TFT fabrication and performance characteristics of $SiN_x$ top-gated NMOS (6,5) SWCNT TFTs demonstrate the feasibility of producing high performance SWCNT TFT backplanes in existing amorphous Si manufacturing lines. (6,5) SWCNT are compatible with high κ dielectrics used in ultrafast electronics, making electronically pure single chirality semiconducting (6,5) SWCNT ink practical for applications in large scale electronics.

These and other aspects and embodiments of the disclosure are illustrated and described below.

BRIEF DESCRIPTION OF THE DRAWINGS

The invention is described with reference to the following figures, which are presented for the purpose of illustration only and are not intended to be limiting.

In the Drawings:

FIG. 14 is cross-sectional view of an e-SWCNT TFT and a summary of the Etch-Stop process flow used in its manufacture, according to one or more embodiments; demonstrating the compatibility of the e-SWCNT TFT fabrication process in conventional fabrication process flow designs.

FIG. 15 is cross-sectional view of an e-SWCNT TFT and a summary of the Back-Channel Etch (BCE) process flow used in its manufacture, demonstrating the compatibility of the e-SWCNT TFT in conventional fabrication process flow designs.

DETAILED DESCRIPTION

Figure 1A:
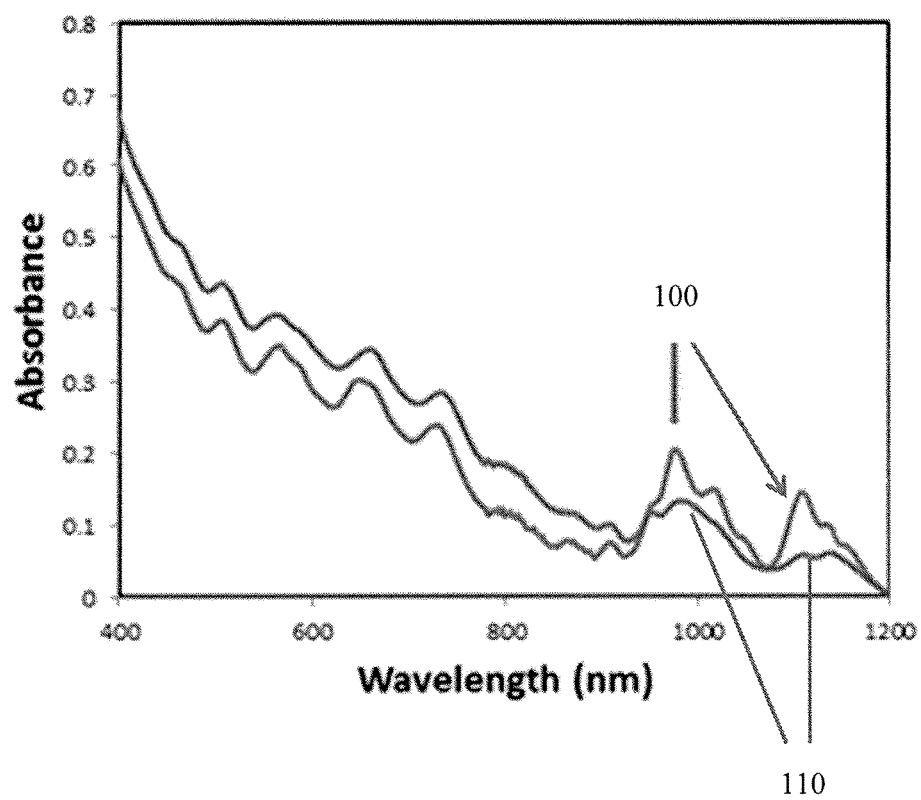
FIG. 1A is a vis-NIR absorption spectrum of an as prepared SWCNT ink (indicated by (6,5) arrows) with enriched (6,5) SWCNT according to one or more embodiments of the invention and a SWCNT solution prepared using a conventional high pressure carbon monoxide process, according to one or more embodiments.

Generally, carbon nanotubes can be either metallic or semiconducting along the tubular axis. For a given (n,m) nanotube, if n=m, the nanotube is metallic; if n−m is a multiple of 3, then the nanotube is semiconducting with a very small band gap, otherwise the nanotube is a moderate semiconductor. However, the presence of metallic CNTs in a semiconducting CNT ink degrades electronic performance. Moreover, currently there exists no reliable screening method to assess the electronic purity of a CNT ink. Conventional spectroscopic methods such as UV-vis spectroscopy, IR and Raman are not sufficiently sensitive to detect small amounts of metal impurities or the presence of metallic CNTs.

Electronically pure semiconducting carbon nanotubes ("e-CNTs") and e-CNT inks are provided. The carbon nanotubes include single-walled carbon nanotubes.

In one or more embodiments, an electronically pure carbon nanotube ink includes a population of single-walled semiconducting carbon nanotubes suspended in a liquid, the ink being essentially free of metallic impurities and characterized in that, when incorporated as a carbon nanotube network in a metal/carbon nanotube network/metal double diode, a nonlinear current-bias curve is obtained on application of a potential from 0.01 V to 5 V.

As used herein "electronically pure semiconducting carbon nanotubes" inks contain essentially only semiconducting single-walled carbon nanotubes and are essentially free of metallic impurities (typically due to residual catalyst used in the synthesis of the CNTs), including metallic carbon nanotubes. "Free of metallic carbon nanotubes" refers to less than 0.01 wt % metallic CNT content. "Essentially free of metallic impurities" refers to both metallic carbon nanotubes and metallic nanoparticles from the catalysts. The electronically pure semiconducting carbon nanotubes are considered free of metallic impurities when the dry SWCNTs contain less than 0.1 wt %, or even less than 0.05 wt % or less than or equal to 0.01 wt % metallic impurity. The amount of metallic impurities can be in a range bounded by any value described hereinabove. The electronically pure semiconducting carbon nanotubes inks described herein may be alternatively referred to as carbon nanotubes (CNTs) and single-walled carbon nanotubes (SWCNT); however, the e-CNT inks are considered to be single-walled to provide superior electrical and electronic properties. Electronically pure carbon nanotube inks are also characterized in that, when incorporated as a carbon nanotube network in a metal/carbon nanotube network/metal double diode, a nonlinear current-bias curve is obtained on application of a potential sweep from 0.01 V to 5 V.

In one or more embodiments, 99.9% or more of the carbon nanotubes are semiconducting.

In one or more embodiments, 99.99% or more of the carbon nanotubes are semiconducting.

In one or more embodiments, the semiconducting carbon nanotubes include one or more of semiconducting carbon or single-walled carbon nanotubes having a chirality associated with semiconducting properties. Exemplary semiconducting carbon nanotubes include semiconducting carbon nanotubes having a chirality of (6,1), (5,3), (7,0), (6,2), (5,4), (8,0), (7,2), (8,1), (6,4), (7,3), (6,5), (9,1), (8,3), (10,0), (9,2), (7,5), (8,4), (11,0), (12, 2), (7,6), (9,4), (11,1), (10,3), (8,6), (9,5), (12,1), (11,3), (8,7), (13,0), (12,2), (10,5), (11,4), (9,7), (10,6), (13,2), (12,4), (14,1), (9,8), (13,3), (18,4), (20,2) and combinations thereof. In one or embodiments, the electronically pure semiconducting carbon nanotubes are of a single chirality. In a particular embodiment, the electronically pure semiconducting carbon nanotubes are (6,5)-SWCNTs.

In one or more embodiments, the e-CNTs and e-SWCNTs are provided in a fluid as a suspension or dispersion, also referred to as an "ink." In one or more embodiments, the e-CNTs and/or e-SWCNTs are present in a concentration in the range of 0.001 μg/mL to 1 mg/mL dispersed in a solvent such as de-ionized water. The dispersion can also include a surfactant, such as sodium dodecyl sulfate, sodium dodecyl benzene sulfate, sodium cholate, sodium deoxycholate and/or the like. The suspension is suitable for use as an ink for printing or depositing e-CNTs and e-SWCNTs as thin films and patterned films. For example, the e-CNTs and e-SWCNTs can be deposited as continuous thin films, and patterning can be introduced post-deposition, such as by etching. Patterned films can also be obtained by direct printing.

e-CNT inks can optionally possess other characteristics and properties. For example, an e-CNT ink can have uniform CNT diameters and/or narrow distribution of CNT lengths. In one or more embodiments, e-CNT inks include CNTs having lengths of between 0.5-2.0 microns. In one or more embodiments, CNTs in the e-CNT ink are all or substantially all the same chirality with uniform diameter. CNT networks and thin films obtained from deposition or printing of the e-CNT inks also have the above noted properties.

In some embodiments, the e-SWCNT tube diameters can be in the range of 0.5 nm to 3 nm. In some embodiments, the e-SWCNTs have a uniform tube diameter of about 0.7 nm as determined from SWCNT to SWCNT. SWCNT networks and thin films obtained from deposition or printing of the e-SWCNT inks also have the above noted properties.

In one or more embodiments, the e-SWCNTs are substantially a single chirality. In one or more embodiments, the e-SWCNTs are substantially only (6,5)SWCNTs. In one or more embodiments, greater than 90%, or greater than 95% or greater than 96%, or greater than 97% or greater than 98%, or greater than 99% or up to 99.9 or up to 99.99% of the SWCNTs are of the same chirality. Chiral purity bounded by any of the values provided above is also contemplated. CNT networks and thin films obtained from deposition or printing of the e-CNT inks also have the above noted properties.

The single chirality and uniform diameter of eSWCNTs can mitigate the variation of carbon nanotube electric properties, and chemical and bio interfaces, rendering promising carbon nanotubes for practical applications in electronics and bio-sensing.

Single-walled carbon nanotube (SWCNT) networks deposited from, e.g., a (6,5) single chirality SWCNT aqueous solution (ink) can be characterized as electronically pure semiconductors based on their performance in a metal/semiconductor Schottky contacts. In one or more embodiments, carbon nanotubes are electronically pure semiconducting carbon nanotubes when they show a non-linear current-bias (I-V) curve when a potential sweep, e.g., a potential sweep of 0.01 V to 5 V, is applied to a metal/carbon nanotube network/metal double diode prepared from the carbon nanotubes of interest. The current-bias curve can be obtained using either complex instruments or portable devices.

In one or more embodiments, a test is provided for determining whether a SWCNT ink is electronically pure. The test includes casting a test SWCNT solution on a borosilicate glass substrate (such as Borofloat 33 glass available from Schottt, or substrate of comparable quality) that has been treated with 0.1% poly(L-lysine) aqueous solution to form a uniform thin layer/film of SWCNTs, and evaporating a Cr(10 nm)/Au(40 nm) bimetal layer onto the SWCNT film to pattern electrodes with channel lengths and widths of 5 µm and 100 µm, respectively. While the SWCNT density is not expected to affect the nonlinearity of the Schottky diode, it may effect current density, with higher SWCNT density providing higher current density. The (6,5) SWCNT density in this particular embodiment is about 5-6 nanotubes per µm$^2$, however, the actual SWCNT density can vary. In one or more embodiments, the CNT density is in the range of 1-1000 nanotubes per cm$^2$ and can be for example, 1-10 nanotubes per cm$^2$ or, 10-50 nanotubes per cm$^2$ or, 50-100 nanotubes per cm$^2$ or 100-200 nanotubes per cm$^2$ or 200-400 nanotubes per cm$^2$ or 400-600 nanotubes per cm$^2$ or 600-800 nanotubes per cm$^2$ or 800-100 nanotubes per cm$^2$ or any range bounded by any value noted hereinabove. The metal/SWCNT/metal double diode is characterized with a semiconductor characterization system such as Keithley 4200 SCS Parameter Analyzer (or any other device capable of applying a voltage sweep and monitoring current output) by applying a potential sweep of 0.01V to 5.0 V across the two electrodes in air at room temperature. Nonlinearity at room temperature indicates that the test SWCNT thin film are electronically pure. In certain embodiments, the nonlinear curve exhibits a power-law behavior.

In certain embodiments, nonlinearity is established by comparison to a "goodness of fit" test for a linear curve. Measures of goodness of fit typically summarize the discrepancy between observed values and the values expected under the model in question. If the discrepancy is within an acceptable range, than the curve can be considered linear and the material and device do not have the characteristics of the electronically pure carbon nanotube ink described herein. For example, a linear regression model can be used to identify the relationship between a current and voltage when all the other variables in the model are "held fixed". If the correlation coefficient is greater than a stated value, for example greater than 0.90, or 0.91, or 0.92, or 0.93, or 0.94, greater 0.95, or greater than 0.96, or 0.97, or 0.98 or 0,99, than the fit of the curve can be considered linear. A curve is considered non-linear when the correlation coefficient in a linear regression analysis is less than 0.80, or less than 0.90.

Electronically pure semiconducting single-walled carbon nanotubes (e-SWCNTs) demonstrate many desirable properties, making them ideal for use in a variety of electronic applications. In addition to use in Schottky diodes, e-SWCNTs can be incorporated into PMOS (p-type metal-oxide-semiconductor) and NMOS (n-type metal-oxide-semiconductor) transistor devices and can be stacked to form CMOS (complementary metal-oxide-semiconductor) inverters that demonstrate performance characteristics comparable to amorphous Si devices. Due to the electronic purity of the e-CNTs incorporated into these devices, performances exceed those seen to date for traditional SWCNT TFTs.

Both large scale PMOS and NMOS devices can be fabricated using SWCNT thin films showing fA-level off current, e.g., $10^{-15}$-$10^{-12}$ A, and $I_{ON}/I_{OFF}$ ratio in the range of $10^6$-$10^{12}$ and optionally $I_{ON}/I_{OFF}$ ratio >$10^8$. CMOS inverters fabricated by wire bonding PMOS and NMOS SWCNT TFTs together can have large voltage gains, and the voltage gain can be greater than 40, or greater than 45 or greater than 50, and up to 200. In one embodiment, a CMOS inverter provided voltage gains as large as 52.

e-SWCNTs can be obtained using a starting material CNT solution that is enriched in carbon nanotubes having the desired chirality, e.g., (6,5) SWCNTs, and that has been prepared from a process that uses low catalyst loads, e.g., less than 3 wt %, followed by careful purification resulting in a SWCNT suspension. e-SWCNTs are purified using ultracentrifugation and/or precipitation of the SWCNT suspension to remove CNT bundles and metal nanoparticle catalysts, followed by two or more separations by column chromatography.

Electronically pure carbon nanotubes can be extracted from a mixture of as-grown carbon nanotubes, including carbon nanotubes obtained using at least one of: arc-discharged growth, chemical vapor deposition, laser-ablation, and high pressure CO conversion, using density gradient ultracentrifugation, gel chromatography, size-exclusion, HPLC, aqueous two phase partition, and/or organic materials wrapping.

Suitable raw materials for the production of e-CNTs include SWCNTs obtained using a high pressure carbon monoxide (HiPCO) process. The HiPCO process was developed at Rice University to synthesize SWCNTs in a gas-phase reaction of an iron catalyst such as iron carbonyl with high-pressure carbon monoxide gas. The iron catalyst is used to produce iron nanoparticles that provide a nucleation surface for the transformation of carbon monoxide into carbon during the growth of the nanotubes. The process is run at elevated pressures, e.g., 10-300 atm (10-300 bar), and elevated temperatures, e.g., 900-1100° C., with CO and iron catalyst vapors being continuously fed into the reactor.

According to one or more embodiments, the HiPCO process is operated using feed conditions that favor the production of a single chirality nanotube (e.g., a predetermined/selected chirality). In one or more embodiments, the HiPCO process is modified to enrich the as-grown carbon nanotubes in the CNT of desired chirality. In one embodiment, the HiPCO process is modified to enrich the as-grown carbon nanotubes in (6,5) SWCNTs.

In particular, the HiPCO process can be performed using feed conditions that favor the production of (6,5) SWCNTs. In one exemplary process, conditions include 10 atm (10 bar) and 1100° C. In one or more embodiments, the catalyst is selected to promote the production of a selected chirality, and in particular to promote the production of (6,5) chiral SWCNT. Exemplary catalysts include pentacarbonyliron, pentacarbonylcobalt, pentacarbonylnickel, pentacarbonylmolybdenum, and pentacarbonylzirconium. Applicants have surprisingly found that the HiPCO process described herein can be run with low catalyst loads, e.g., <3 wt. The use of low catalyst loads reduces the level of metal impurities that need to be removed in subsequent purification processes and result in a lower metal content in the CNT ink.

FIG. 1A shows the spectra of as-made HiPCO CNT showing the difference from other HiPCO CNTs. FIG. 1A is a plot of vis (visible)-NIR (near infrared) absorption of a sample prepared according to a process in accordance with some embodiments of the present disclosure, the plot showing SWCNT solution enhanced in (6,5) SWCNTs (shown by arrow), as compared to a conventionally HiPCO processed material. The curve 100 shows increased absorbance in the 980-990 nm and 1100-1200 nm regions, which is indicative of an increase yield of (6,5) SWCNT as compared to a conventionally prepared SWCNT, such as that commercially available from Nanointegris shown as curve 110. The increased intensity of curve 100 between 980-1220 nm demonstrate that the e-CNT ink according to one or more embodiments of the invention is enriched in semiconducting SWCNTs by 2-fold as compared to the conventional CNT solution. Nanointegris 99% CNT inks contain many different species with different diameters and chiralities. In comparison, the electronically pure SWCNT inks only contain one diameter and one chirality.

Figure 1B:
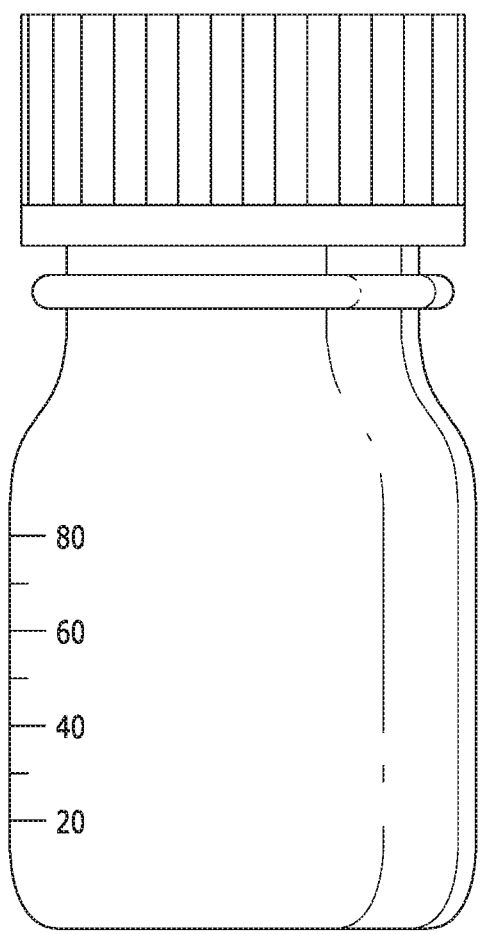
FIG. 1B is a photo image of 100 mL ink containing electronically pure (6,5) SWCNTs with concentration of 0.6 μm/mL, according to one or more embodiments.

The as-prepared SWCNTs are then purified to obtain the e-SWCNT ink. SWCNT raw powder enriched in (6,5) SWCNTs was prepared as described above using a Rice University Mark III high pressure carbon monoxide reactor (Batch number 190.1). The SWCNT raw powder was dispersed in 2% sodium dodecyl sulfate (SDS) aqueous solution (deionized water) using a tip sonicator with 20 Watts of power for 8 hours. After ultracentrifuge or precipitation to remove carbon nanotube bundles and metal nanoparticle catalyst impurities, the decanted supernatant solution was transferred to a Saphacryl S-200 gel column for carbon nanotube separation. The SWCNTs trapped in the gel were eluted out with 2% SDS solution. After 4-6 cycles of gel chromatography, the pure purple solution was collected in a concentration of 6 µg/mL. An image of the purified solution is shown in FIG. 1B, and the purity of the solution was assessed initially using vis (visible)-NIR (near infrared) absorption, NIR fluorescence emission spectra and Raman spectroscopy.

Figure 1C:
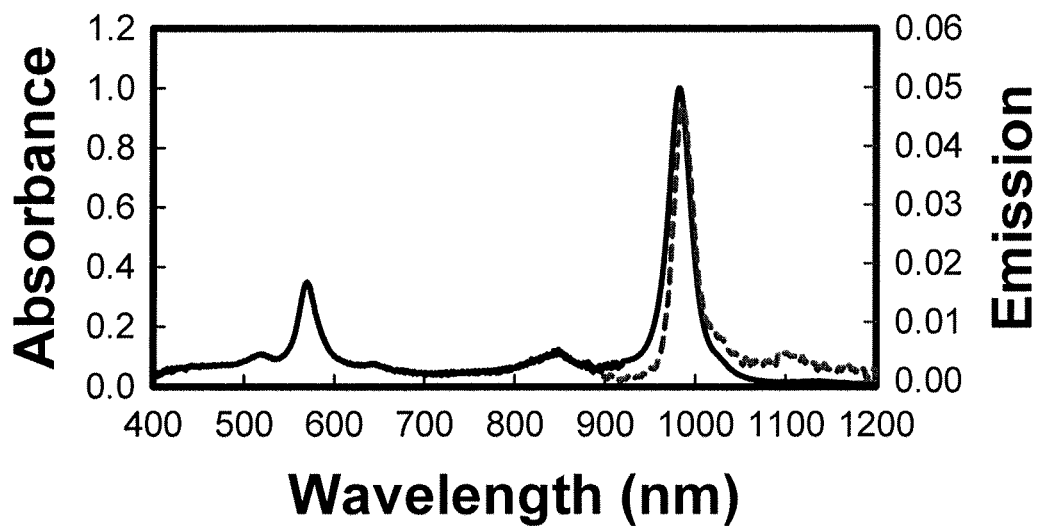
FIG. 1C is vis-NIR absorption spectrum (solid curve) and NIR fluorescence emission spectrum (dashed curve, excited at 532 nm) of the electronically pure (6,5) SWCNT ink of FIG. 1B, according to one or more embodiments.
Figure 1D:
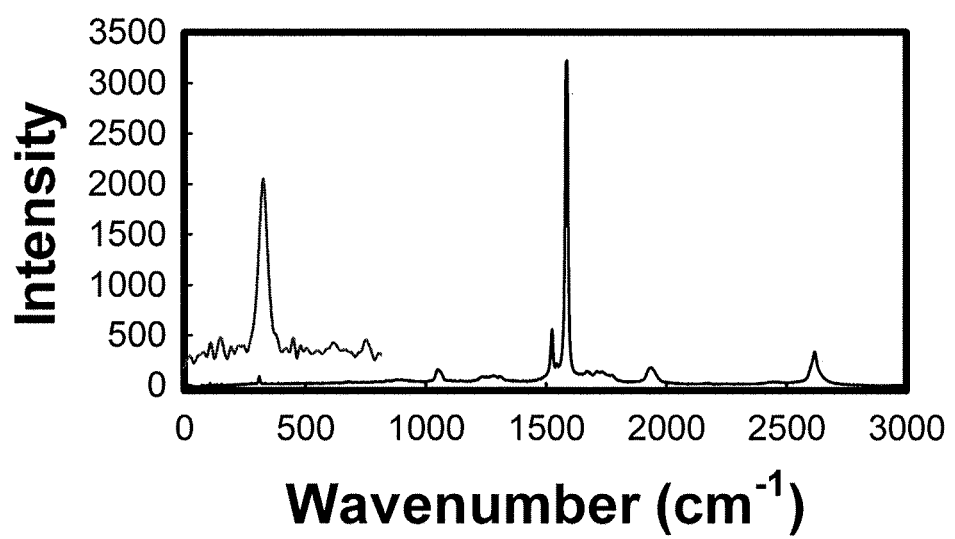
FIG. 1D is a Raman Spectrum of the electronically pure (6,5) SWCNT ink of FIG. 1B, excited at 532 nm laser beam, according to one or more embodiments; the enlarged RBM peak band at 310 $cm^{-1}$ is shown in the insert box.

FIG. 1C characterizes the final product with sole diameter of 0.7 nm and one chirality of (6,5). The Vis (visible)-NIR (near infrared) absorption and NIR fluorescence emission spectra of the collected purple solution were recorded on an NS3 Applied Nano Spectralyzer at ambient temperature, and are reported. In the absorption spectrum, two major absorbance peaks at 983 nm (extinction coefficient: 4400 $M_{-1}$ $cm_{-1}$) and 570 nm with FWHM (Full Width at Half Maximum) of 30.5 nm and 30 nm, respectively, are assigned to the $S_{11}$ and $S_{22}$ transition between the van Hove Singularities of (6,5) chirality SWCNT. A broad band between 800 nm and 880 nm is considered to be the sideband of the $S_{11}$ transition. When the solution was excited with a 532 nm laser light source, the fluorescence emission was detected as a 986 nm peak with a FWHM of 26.5 nm and a broad band between 1060 nm and 1160 nm, as illustrated by the dashed curve in FIG. 1C. The negligible Stokes shift (3 nm) and narrow FWHM indicate the high purity of (6,5) SWCNT. The solution was further characterized with Raman spectroscopy on an NS3 Applied Nano Spectralyzer, and the corresponding Raman spectrum is shown in FIG. 1D. When the solution was excited with a 532 nm laser beam, the Raman scattering was detected as a strong tangential G band (G from Graphite) at 1587 $cm_{-1}$ ($\omega_G^+$, 15 $cm^{-1}$ FWHM) and 1525 $cm_{-1}$ ($\omega_G^-$ 3 $cm^{-1}$ FWHM), a disorder induced D band in the range of 1200-1325 $cm^{-1}$, a second order overtone G' at 2617 $cm^{-1}$, and a weak RBM (Radial Breathing Model) band at 310 $cm_{-1}$ ($d_t=\alpha/\omega_{RBM}=248$ $cm^{-1}$ nm/310 $cm^{-1}=0.8$ nm). These Raman Scattering peaks correspond to $sp^2$ carbon-carbon stretching and radial expansion-contraction of (6,5) SWCNT, further corroborating the results of Vis-NIR absorption and NIR fluorescence emission. The peak ratio of D/G is estimated to be 0.03, reflective of less defective (6,5) SWCNT. The D/G ratio provide information about the quality of CNT and the amount of defect sites. The general D/G ratio is greater than 0.1, and the electronically pure SWCNTs exhibit significantly less defects.

The utility of the e-SWCNTs described herein is further demonstrated by the results of incorporation of the nanotubes into electrical and electronic devices.

Figure 2A:
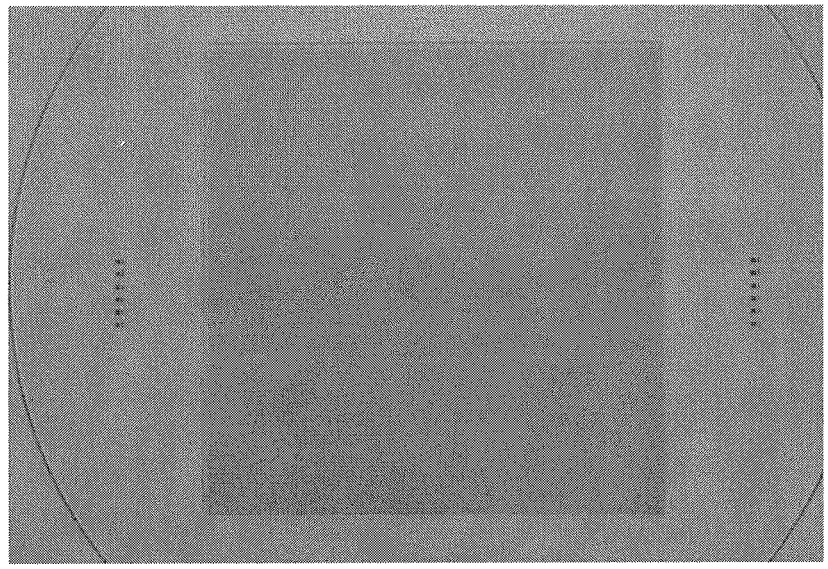
FIG. 2A is a photo image of Borofloat 33 glass (Diameter: 100 mm, Thickness: 500 μm) coated with (6,5) SWCNT thin films inside patterned Au/Cr electrodes with channel length of 5 μm and channel width of 100 μm.
Figure 2B:
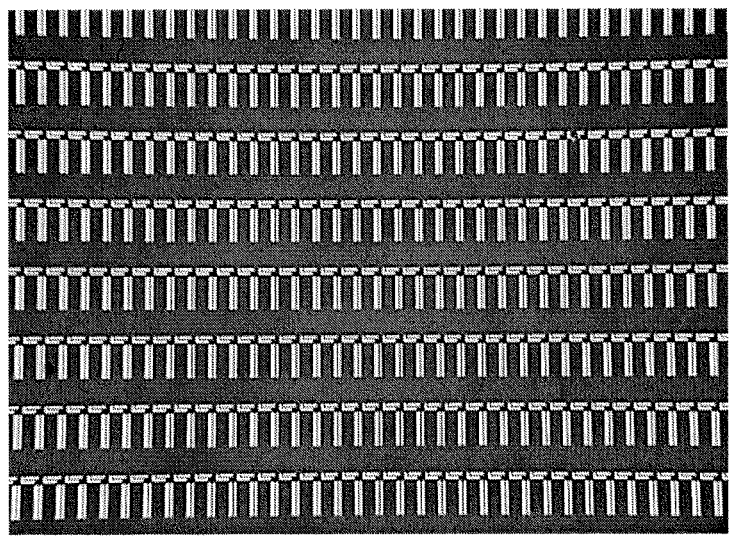
FIG. 2B is an enlarged image of FIG. 2A, according to one or more embodiments.
Figure 2C:
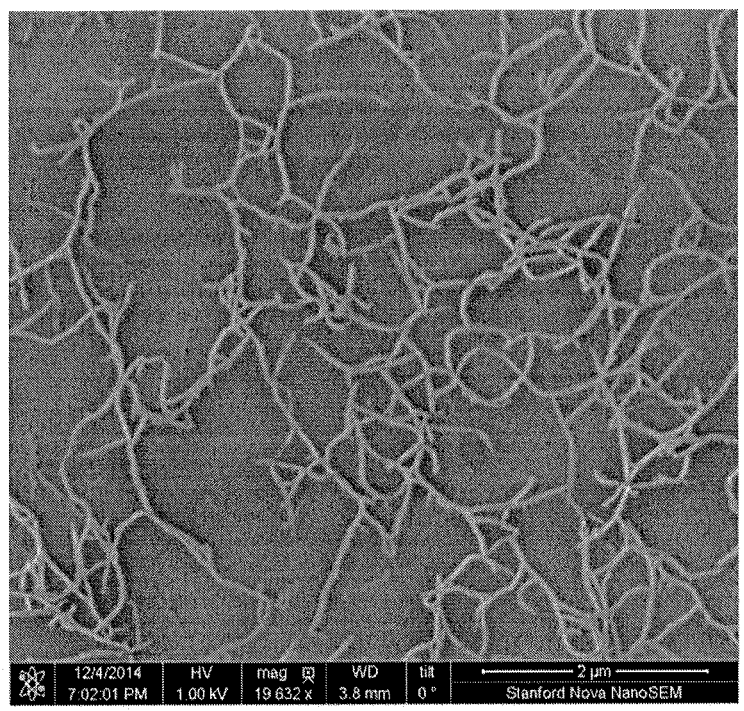
FIG. 2C is an SEM image of (6,5) SWCNT thin film inside the patterned electrodes showing tube length in the range of 1~2 μm and tube density of 4~6 tubes per $μm^2$, according to one or more embodiments.
Figure 2D:
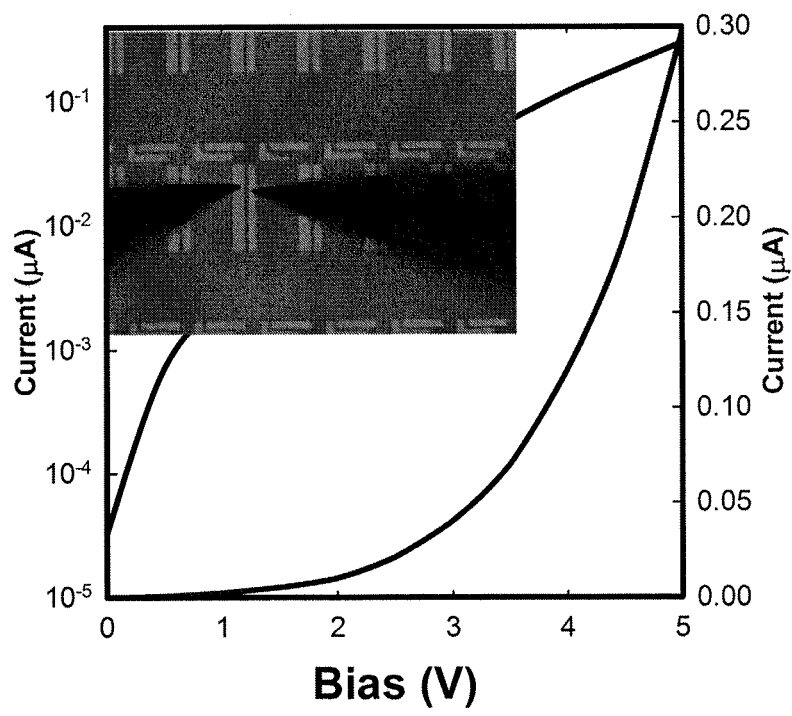
FIG. 2D is a plot of the measured current versus bias curve showing nonlinear behavior for a Schottky diode prepared using e-SWCNTs, when probed on two electrodes (inserted microimage) on a SemiProbe PS4L M12 probe station with Keithley 4200 SCS, according to one or more embodiments.
Figure 6:
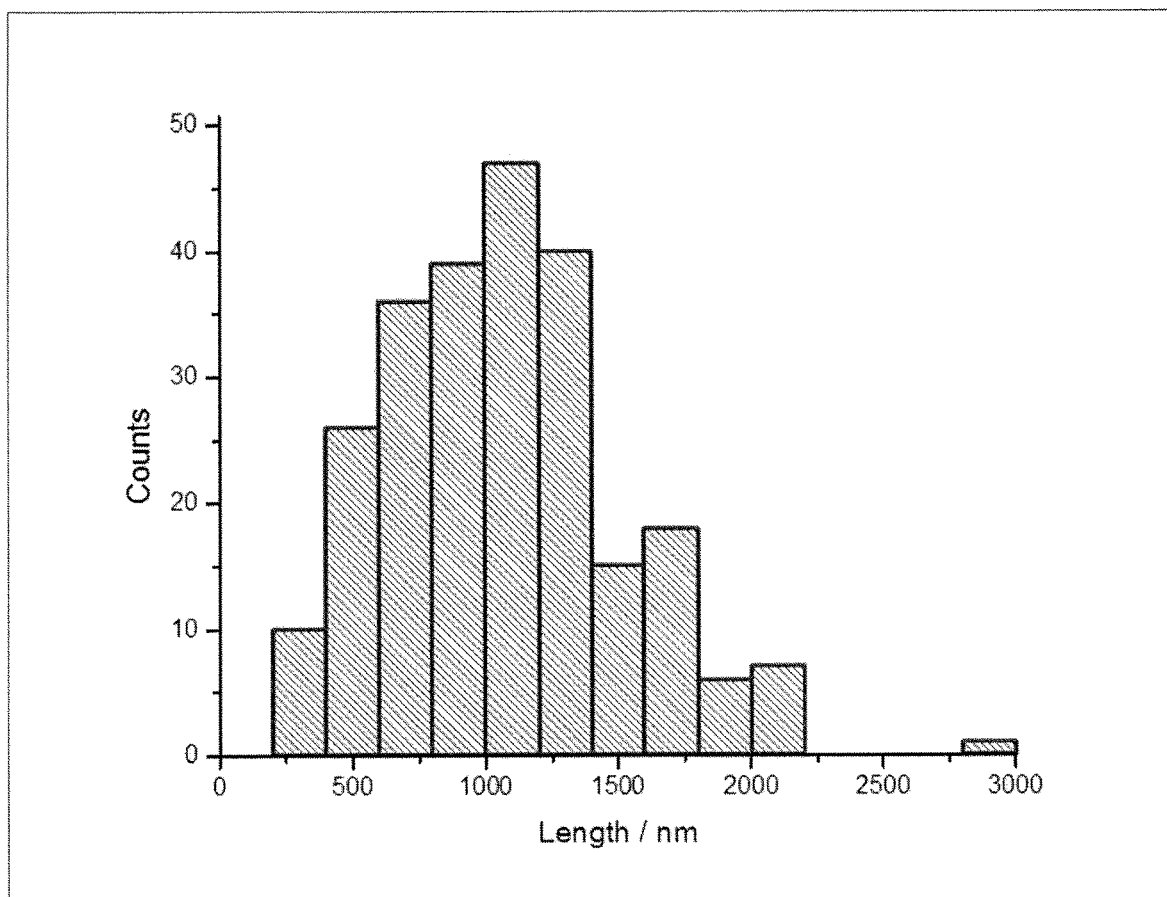
FIG. 6 is a histogram of (6,5)SWCNT lengths extracted from SEM images, according to one or more embodiments.

In one or more embodiments, e-SWCNTs are incorporated into a diode, such as a Schottky contact, including metal electrodes evaporated on an electronically pure semiconducting CNTs or SWCNTs thin film network, to provide a diode demonstrating non-linear current-bias (I-V) curves. In one example, the purple e-SWCNT solution was cast on 0.1% poly(L-lysine) aqueous solution treated Borofloat 33 glass (Diameter: 100 mm, Thickness: 500 µm) to form a uniform thin layer/film of (6,5) SWCNTs with high transparency. The resulting thin film is shown in FIG. 2A. On top of the (6,5) SWCNT thin film, Cr(10 nm)/Au(40 nm) bimetals were evaporated to pattern electrodes with channel lengths and widths of 5 µm and 100 µm, respectively. The electrodes are shown in the microphotograph in FIG. 2B. The (6,5) SWCNT thin film between two electrodes was imaged with an SEM (scanning electron microscope), and the imaging revealed a layer of well-dispersed nanotubes in the form of a network, as illustrated in FIG. 2C. The (6,5) SWCNT density is about 5-6 nanotubes per $\mu m^2$. The average length of the (6,5) SWCNTs is about 1-2 µm, as is illustrated in the histogram of FIG. 6 showing the distribution of CNT lengths observed in by SEM. The metal/(6,5) SWCNT/metal double diodes were characterized with a Keithley 4200 SCS (Semiconductor Characterization System) (see the probes visible in the inset to FIG. 2D) in air at room temperature. A typical current-bias curve is displayed in FIG. 2D and has a pronounced gap-like nonlinearity. The curve seems to exhibit a power-law behavior, that is current $\propto$ (bias)$^\alpha$, $\alpha>1$. The nonlinearity at room temperature indicates that (6,5) SWCNT thin film are semiconducting with essentially no metallic impurities. The devices are semiconducting SWCNT networks connected to two metal contacts, that is, two Schottky-type diodes connected back to back.

Figure 2E:
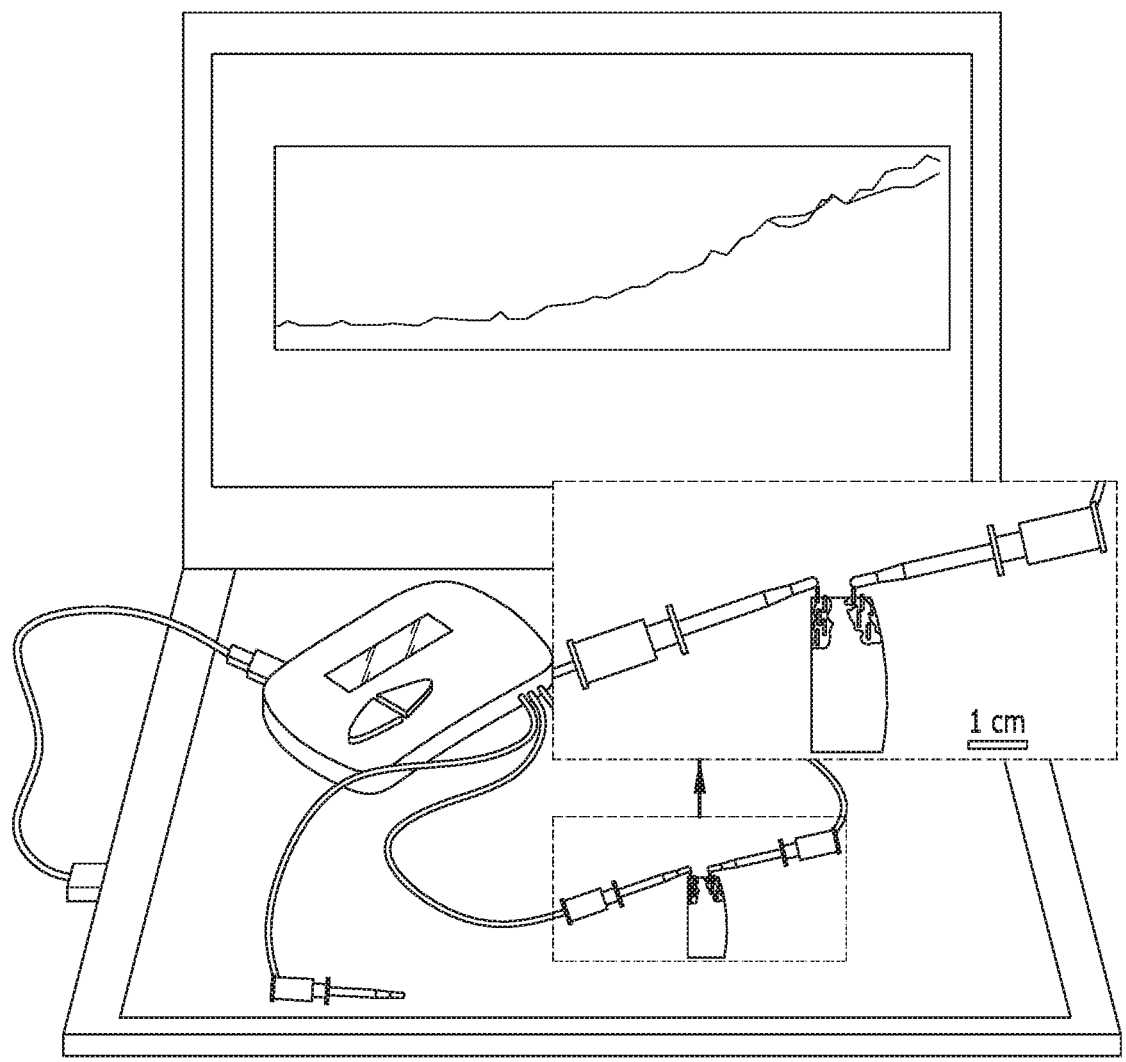
FIG. 2E shows a photograph of an altas DCA Pro controlled by laptop used to characterize (6,5) SWCNT thin film on a small piece of silicon wafer (500 nm $SiO_2$) showing a nonlinear curve; gold electrodes were aerosol jet printed to form a device with channel length of 50 μm and channel width of 10 mm and bonded with two copper wires (diameter: 0.5 mm) for connections with the altas DCA Pro.
Figure 2F:
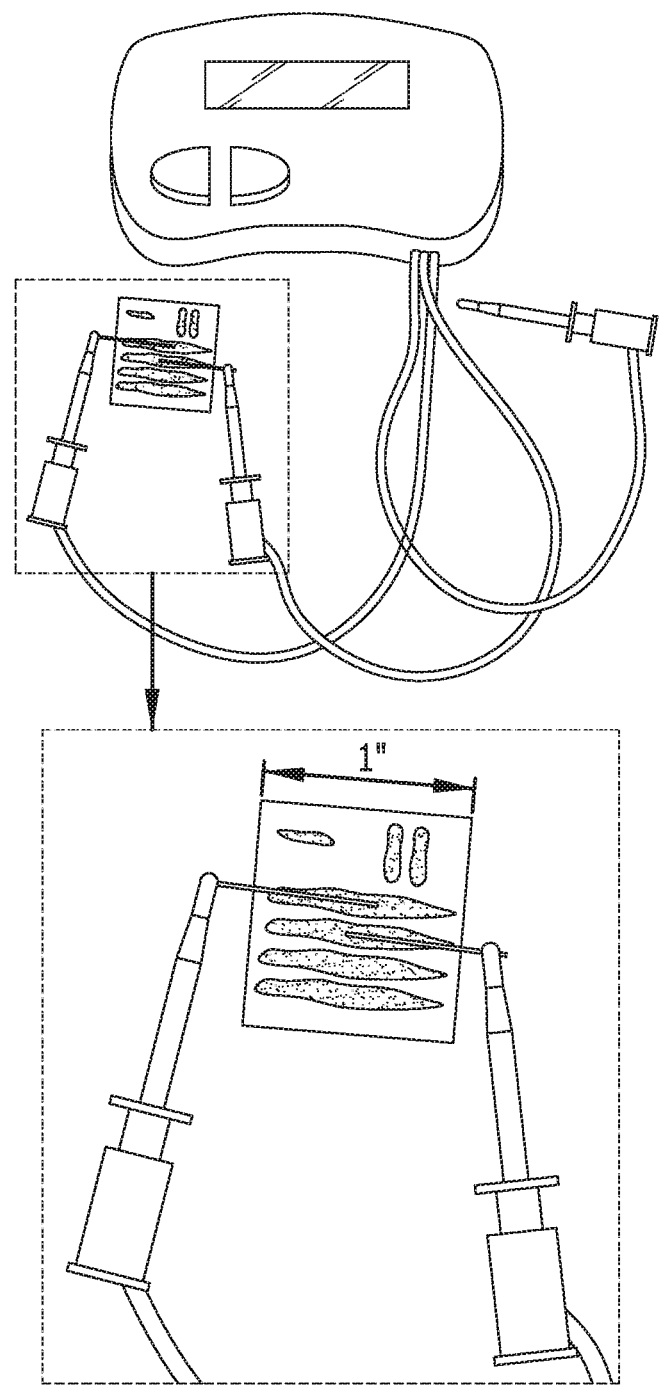
FIG. 2F shows a photograph of a metal/SWCNT/metal double diode using (6,5) SWCNT coated quartz (2.5 cm×2.5 cm), on which two copper wires (0.5 mm) were bonded with silver paste to form a metal/(6,5) SWCNT/metal device with channel length of 2 mm, and channel width of 2.5 cm, according to one or more embodiments.

The nonlinear current-bias curve can be explored for the examination of purity of semiconducting SWCNTs electronically in an elegant and convenient way. In this example, the purple e-SWCNT solution was cast on a small piece of a 0.1% poly(L-lysine) aqueous solution treated silicon wafer (1 cm×3 cm, 500 nm $SiO_2$) to deposit a (6,5) SWCNT thin film. On the top of the (6,5) SWCNT thin film, two 10 mm long gold electrodes separated by 50 µm were aerosol jet printed using a suspension of 4 nm gold nanoparticles in xylene (40 weight %), followed by curing at 200° C. The two electrodes were contacted with two copper wires (diameter: 0.5 mm) using silver paste and soldered with metal Tin (the insert to FIG. 2E). The simple metal/(6,5) SWCNT/metal chip was connected to an Atlas DCA Pro from Peak Instrument controlled with a laptop. As shown in FIG. 2E, the graph displays nonlinear curves. The purple solution was also cast on a 2.5 cm×2.5 cm quartz pretreated with 0.1% poly(L-lysine) aqueous solution to obtain a (6,5) SWCNT thin film. Silver paste was cast on the top of the (6,5) SWCNT thin film to form two 2.5 cm long silver electrodes separated in 2 mm (FIG. 2F). A similar nonlinear curve was observed. Thus, performance was substantially not affected by the choice of metal electrodes. The generality of nonlinearity with different metals in various substrates further demonstrated that these (6,5) SWCNT thin films deposited from purple solution are electronically pure semiconductors.

Figure 10:
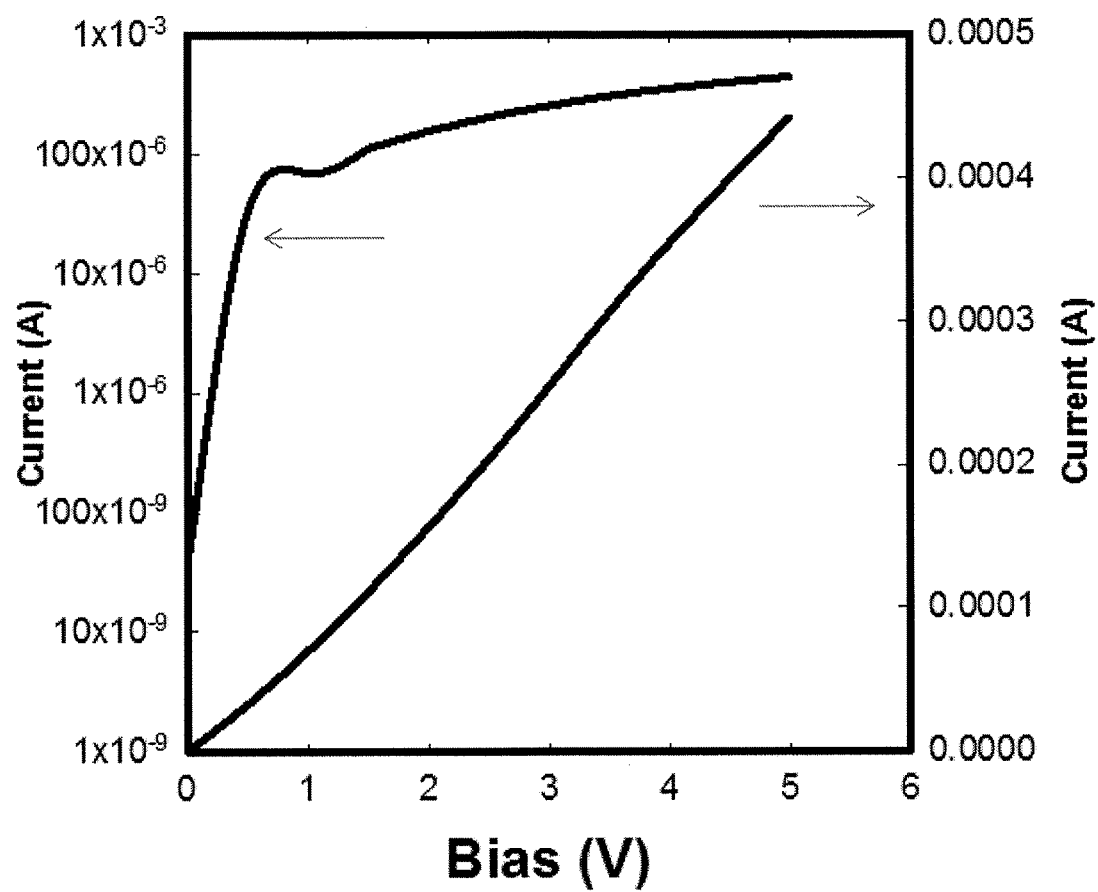
FIG. 10 is a plot showing the measured current versus bias curve showing linear curve for a Schottky diode prepared using Nanointegris IsoNanotubes-S 99% semiconducting single-walled carbon nanotubes, when probed on two electrodes.

The non-linearity of the current-bias curve displayed for diode devices using the e-SWCNTs of the current invention are compared to the typically linear current-bias curve displayed for diode devices using other semiconducting SWCNTs. FIG. 10 is a plot of the measured current versus bias curve for a Schottky diode prepared using Nanointegris Isonanotubes-S 99% semiconducting single-walled carbon nanotubes. When probed on two electrodes over a potential sweep of 0 V to 5 V, the current-bias response is linear. Thus, despite representation by the manufacture of low metal content and 99% semiconducting SWCNT contents (see, e,g, Nanointegris Carbon Nanotube Material Data Sheet), devices prepared using such SWCNTs do not demonstrate pure semiconducting behavior.

In one or more embodiments, the e-SWCNTs can be incorporated into thin film transistors having channel widths ranging from 1 nm to 200 nm, or 50 nm and higher. In one or more embodiments, top-gated NMOS and PMOS devices incorporating electronically pure semiconducting CNTs or SWCNTs can be prepared. The NMOS and PMOS devices possess extremely low off currents, e.g., on the order of fA, and a high $I_{ON}/I_{OFF}$ ratio, e.g., >$10^8$ $I_{ON}/I_{OFF}$ ratio. In certain embodiments, off currents can be in the range of $10^{-15}$-$10^{-12}$ A and $I_{ON}/I_{OFF}$ ratios can be in the range of $10^6$-$10^{12}$.

In one or more embodiments, a top-gated $SiN_x$ thin film transistor (TFT) is provided.

Generally, an electronically pure carbon nanotube thin film for use in preparing thin film transistors can be prepared by applying the e-CNT ink onto a suitably treated substrate. For example, substrates can be treated in an ozone oven, e.g., for 15 minutes, followed by treatment with a poly(l-Lysine) solution, e.g., with 0.1% poly(l-Lysine). After drying, the electronically pure carbon nanotube ink can be directly coated on poly(l-Lysine) treated substrates using conventional methods such as spraying, dipping, spin coating, and/or the like. Alternatively, the transparent electronically pure semiconducting single chirality (6,5) SWCNT thin film can be deposited with solution processes suitable for roll-to-roll fabrication on transparent plastics like polyethylene film. The e-CNT thin film can be patterned using photolithography and etched by oxygen plasma. The (6,5) SWCNT thin film between two electrodes was imaged with an SEM, and was shown to exhibit a layer comprising a well-dispersed nanotube network. The (6,5) SWCNT density was about 5-6 nanotubes per $\mu m^2$, and the average length of the (6,5) SWCNTs was around 1~2 μm.

In preparing an n-type thin film transistor, source/drain metal electrodes can be deposited using conventional methods such as sputter deposition, evaporation, or ebeam. The drain/source metal electrodes can be patterned using photolithography and etched by dry-etch, wet-etch, or lift-off.

Silicon nitride has widely been used as the dielectric in amorphous silicon thin film transistors. In preparing an n-type thin film transistor, an amorphous silicon nitride film ($SiN_x$) can be deposited with plasma enhanced chemical vapor deposition (PECVD) at over a range of temperatures and feeding ratios, or sputtering. The energy levels of defect states in amorphous silicon nitride are used to identify the nature of trap states responsible for charge trapping. The interface provides a channel for tailoring the free charge and trapped charge by gate potential. Both the interface and bulk properties of SiNx dielectrics depend on the deposition process and conditions involved: e.g., chemical vapor deposition, plasma deposition, sputtering deposition at different temperatures, and $NH_3/SiH_4$ ratios. For example, the interface states between carbon nanotube and silicon nitride dielectrics can depend on the silicon nitride deposition method used, the feeding ratio and the temperature.

In one embodiment, electronically pure, single-chirality (6,5) single-walled carbon nanotube thin film transistors were fabricated with top-gated SiNx deposited by sputtering at a substrate temperature of 350° C. with a feeding ratio of 33.5 sccm$NH_3$/40 sccm $SiH_4$. In one embodiment, SiNx is deposited using PECVD, at a temperature of 225° C. and a feeding ratio of $NH_3/SiH_4$ that was varied from 3 sccm/5.3 sccm, to 10 sccm/5.3 sccm, to 15 sccm/5.3 sccm. Top-gated (6,5) SWCNT TFTs showed good performance for SiNx deposited at low temperature (225° C.) with 10 sccm $NH_3$/5.3 sccm $SiH_4$ feeding ratio. Without wishing to be bound by theory, these obtained results were interpreted as the effect of the interface states between (6,5) SWCNT and SiNx dielectrics that provide the channel for the applied gate potential to modulate the ratio of free electrons to trapped electrons by the defect sites in bulk SiNx dielectrics. In certain embodiments, an amorphous silicon nitride film can be deposited with plasma enhanced chemical vapor deposition at a temperature lower than 225° C., and a feed ratio of $NH_3/SiH_4$ greater than 1.

Gate metal electrodes can be deposited using conventional methods including sputtering, evaporation, and ebeam deposition. Gate metal electrodes can be patterned using photolithography and etched by dry-etch, wet-etch, or lift-off.

Figure 3A:
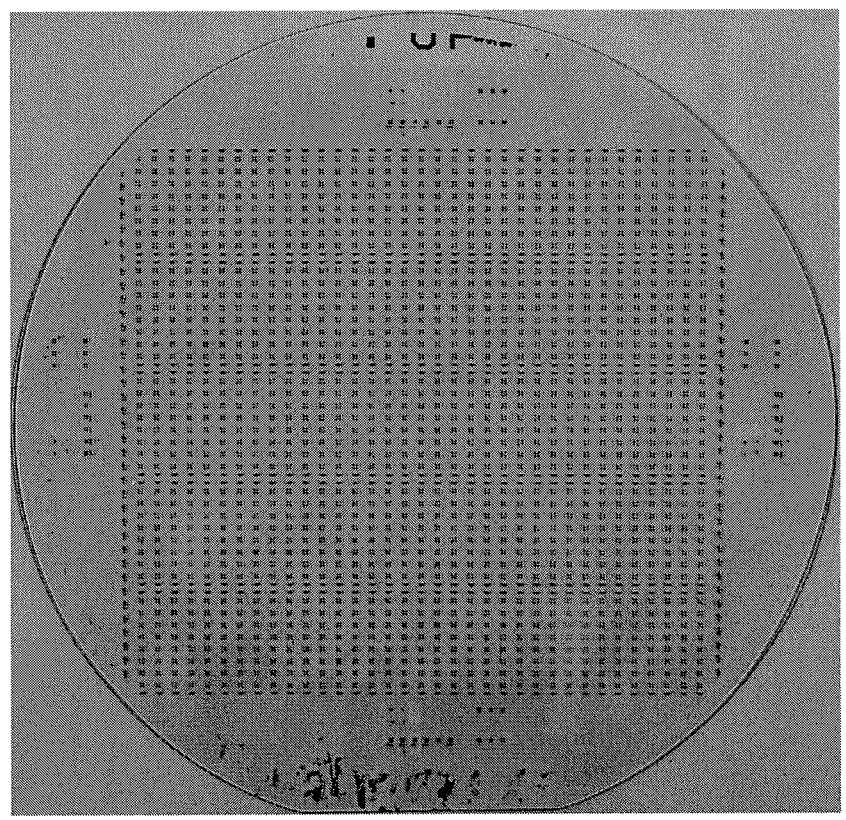
FIG. 3A is a photo image of 1440 unit (6,5) SWCNT TFTs fabricated using photolithography on Borofloat33 Glass (Diameter: 100 mm, Thickness: 500 μm) of a fixed 5 μm channel length and a series of channel widths from 5 μm, 25 μm, 50 μm, 75 μm to 100 μm, according to one or more embodiments.
Figure 3B:
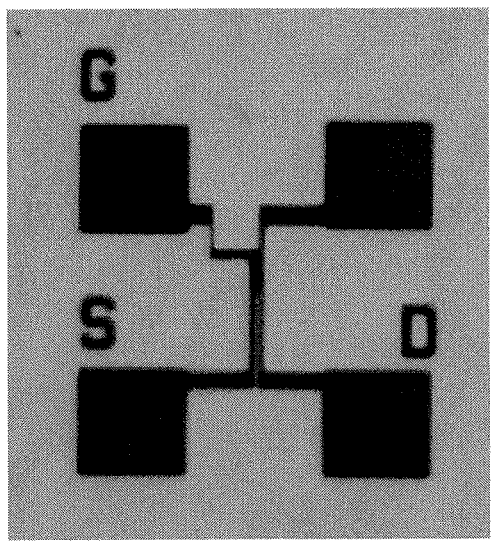
FIG. 3B is a micro image of one SWCNT TFT with a channel width of 50 μm.
Figure 3C:
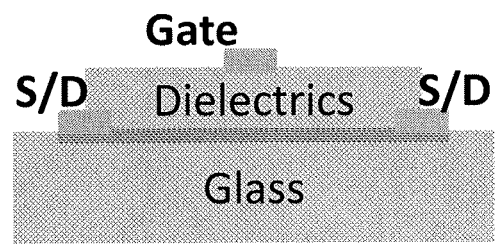
FIG. 3C is a schematic illustration of the $SiN_x$ top-gated (6,5) SWCNT TFTs of FIG. 3B viewed from cross section, according to one or more embodiments.
Figure 3D:
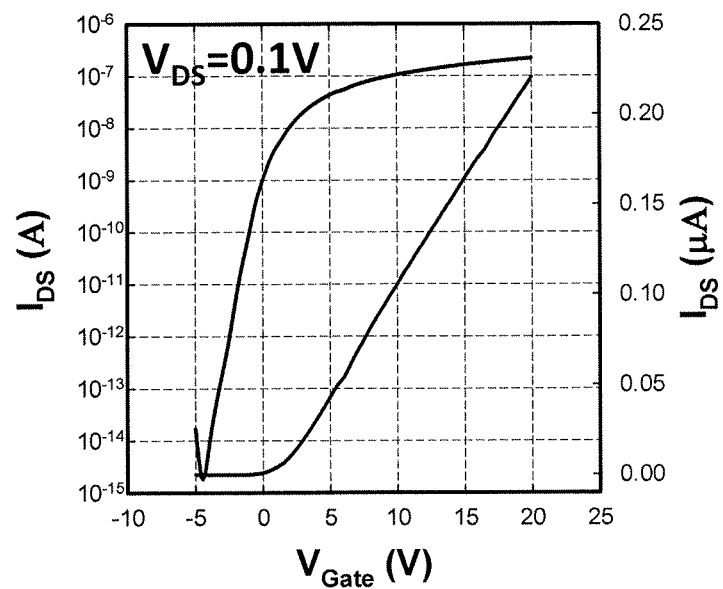
FIG. 3D is a plot showing the typical transfer characteristics of a $SiN_x$ top-gated (6,5) SWCNT TFT with a channel width of 50 μm showing fA off-current and >$10^8$ $I_{ON}/I_{OFF}$ ratio by sweeping $V_{Gate}$ from −5 V to 20 V (right $I_{DS}$ is linear scale and left $I_{DS}$ is log scale) under $V_{DS}$=0.1 V, according to one or more embodiments.
Figure 3E:
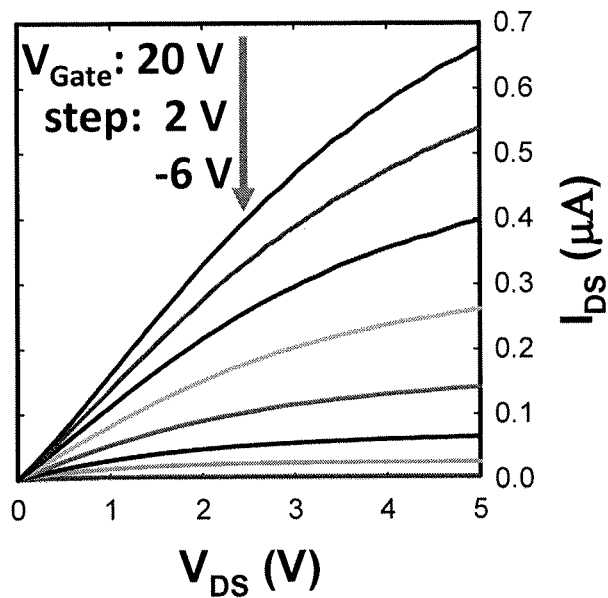
FIG. 3E is a plot showing the output characteristics of bending curves by sweeping $V_{DS}$ from 0V to 5V; the curves bend down as $V_{Gate}$ switched from 20 V to 0 V with step of 2V, according to one or more embodiments.
Figure 3F:
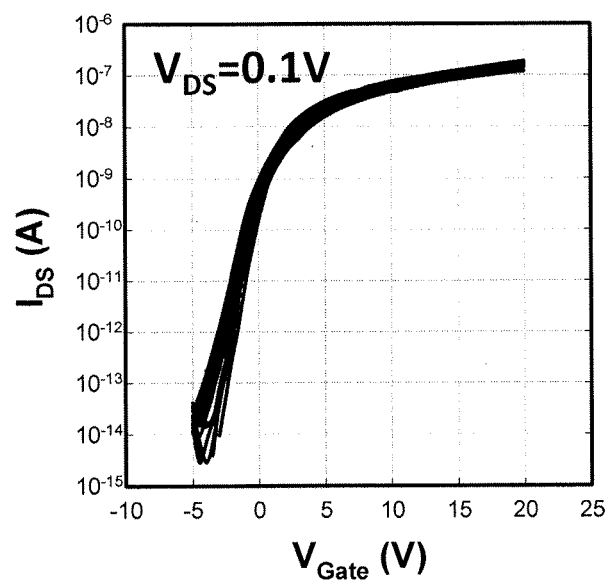
FIG. 3F is a plot showing the transfer characteristics of 20 $SiN_x$ top-gated (6,5) SWCNT TFTs with channel width of 50 μm to illustrate the reproducibility and consistency of the devices, according to one or more embodiments.
Figure 8:
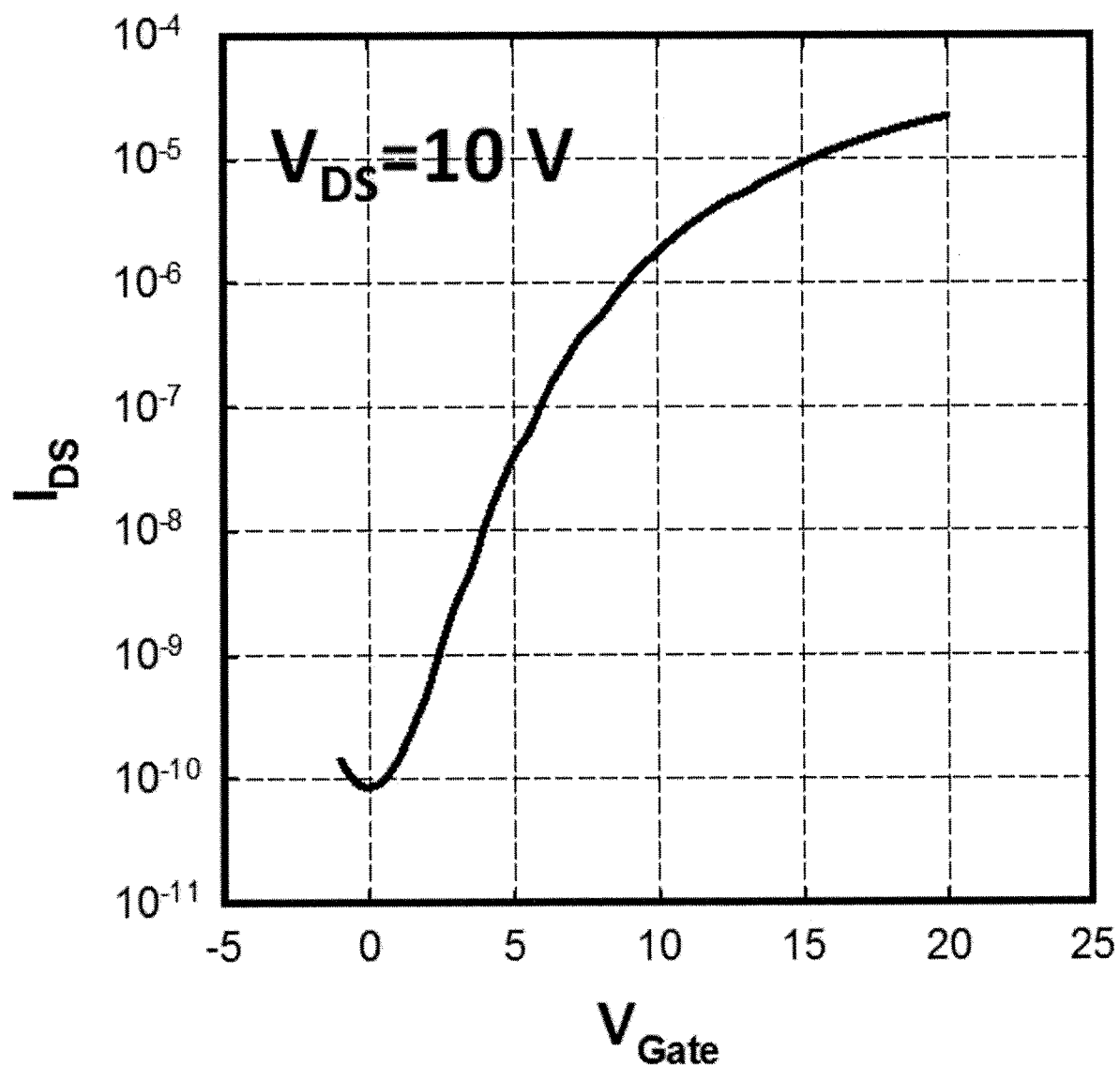
FIG. 8 is a plot showing the transfer characteristics of NMOS (6,5) SWCNT TFTs with channel width of 50 μm, VDS=10 V, according to one or more embodiments.
Figure 9:
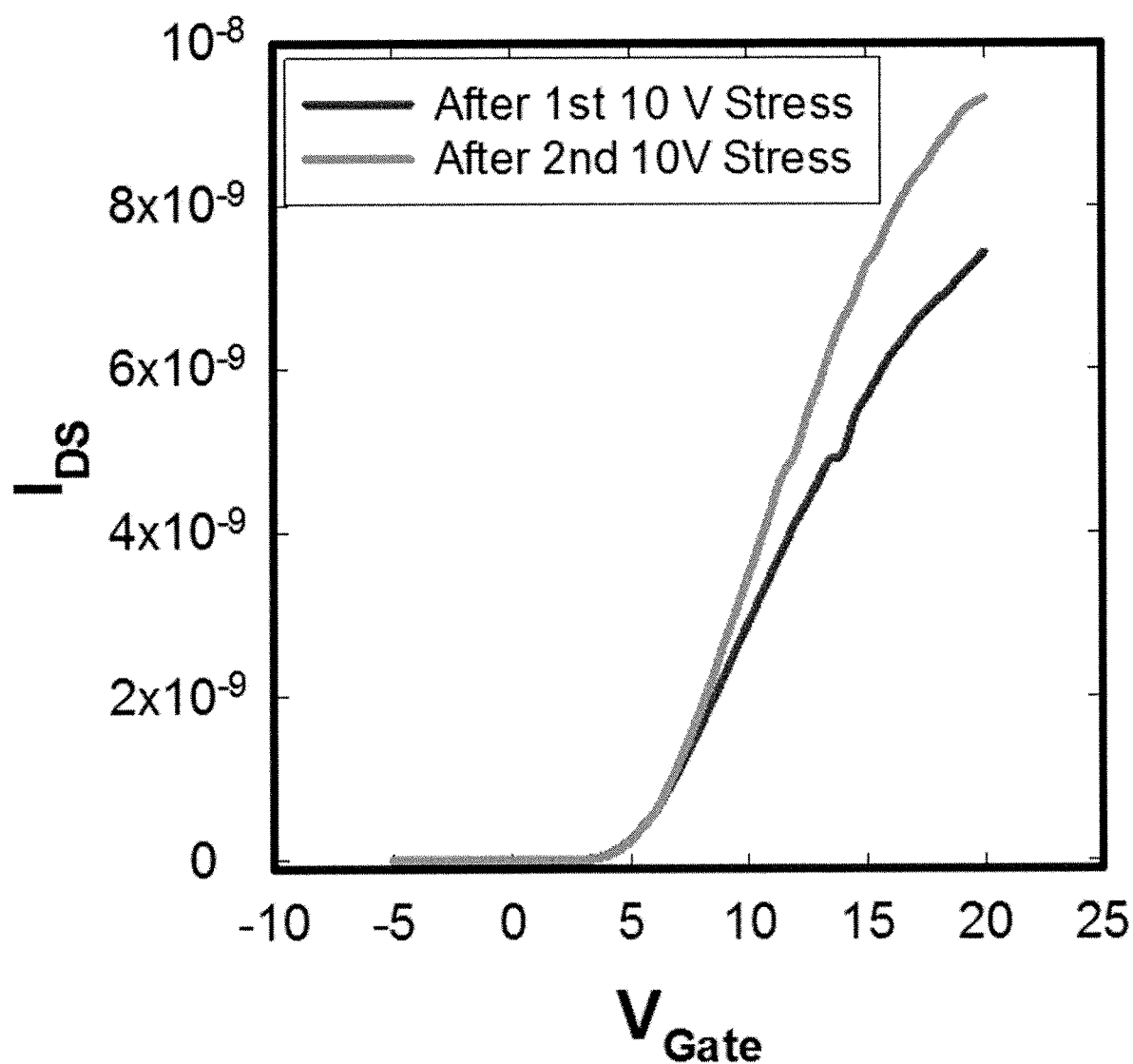
FIG. 9 is a plot showing the transfer characteristics of NMOS (6,5) SWCNT TFTs with channel width of 50 μm before and after 10 V bias stress for 1 hour, according to one or more embodiments.

In one example, Borofloat33 Glass was coated with a thin layer/film of (6,5) SWCNTs, and about 1440 (row: 40, column: 35) unit thin film transistors (TFTs) of a fixed 5 μm channel length and a series of channel widths from 5 μm, 25 μm, 50 μm (3 rows), 75 μm to 100 μm (2 rows) were fabricated using photolithography. The finished e-SWCNT/electrode system is shown in FIG. 3A. Next, Cr(10 nm)/Au (40 nm) bimetals were evaporated to pattern drain/source electrodes. The (6,5) SWCNT thin film was patterned by $O^2$ plasma etching. Over the patterned transistors, a layer of 170 nm SiNx was deposited using plasma enhanced chemical vapor deposition (PECVD). Another Cr(10 nm)/Au(90 nm) layer was evaporated to pattern gate electrodes on the SiNx layer. The SiNx layer over the drain/source test pads were opened using dry etching. The formed (6,5) SWCNT TFT was photographed as shown in FIG. 3B. The cross section diagram is presented in FIG. 3C. These (6,5) SWCNT TFTs were characterized with a Keithley 4200 SCS under a Semiprobe PS4L M12 probe station in air at room temperature. The typical transfer characteristics of a (6,5) SWCNT TFT with channel width of 50 μm is presented in FIG. 3D. Under $V_{DS}$=0.1 V, the $I_{DS}$ increased from 1.8 fA to 0.22 μA when $V_{Gate}$ swept from −5 V to 20 V. It is worth noting that the fA off-current of (6,5) SWCNT networks is similar to those of amorphous silicon TFTs and comparable to those of single semiconducting SWCNT devices. The device is an NMOS with $I_{ON}/I_{OFF}$ greater than $10^8$. Its threshold voltage ($V_T$) is estimated to be 1.5 V and its subthreshold swing (ss) is estimated to be 592 mV/dec. The device was stressed with $V_{DS}=10$ V at room temperature for one hour, however, there was negligible $V_T$ shift, as evidenced in the plot shown in FIG. 8. When $V_{DS}=10V$ was applied, the on current reached 30 μA, which can be used to drive organic light emitting diodes (see FIG. 9). Their output characteristic is measured by sweeping $V_{DS}$ from 0 V to 5 V, as is shown in FIG. 3E. The downward bending $I_{DS}$-$V_{DS}$ curve moved down when $V_{Gate}$ decreased from 20 V to 0 V with steps of 2V. The saturated $I_{DS}$ was observed when $V_{Gate}$ was under 10 V. The electron mobility (μe) was estimated to be 0.5 cm$^2$/Vs when capacitance per unit of SiNx was 24 nF/cm$^2$. The transfer characteristics of over 20 devices with 50 μm channel width were plotted in FIG. 3F showing repeatability and consistency among devices. Their threshold voltage shifts are within ±0.1 V. These performances resemble those of amorphous silicon TFTs.

Figure 3G:
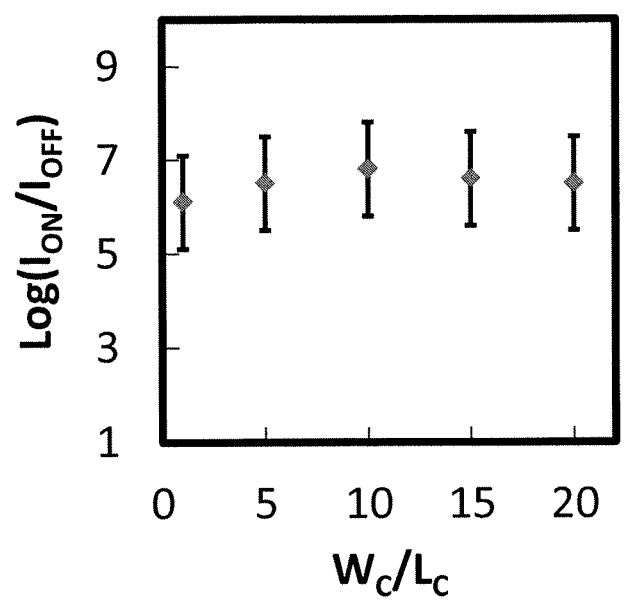
FIG. 3G is a plot showing the $I_{ON}/I_{OFF}$ ratio variation of different channel widths eliciting consistent $I_{ON}/I_{OFF}$ ratios in a series of channel widths from 5 μm, 25 μm, 50 μm, 75 μm to 100 μm, reflective of an electronically pure semiconductor, according to one or more embodiments.
Figure 7:
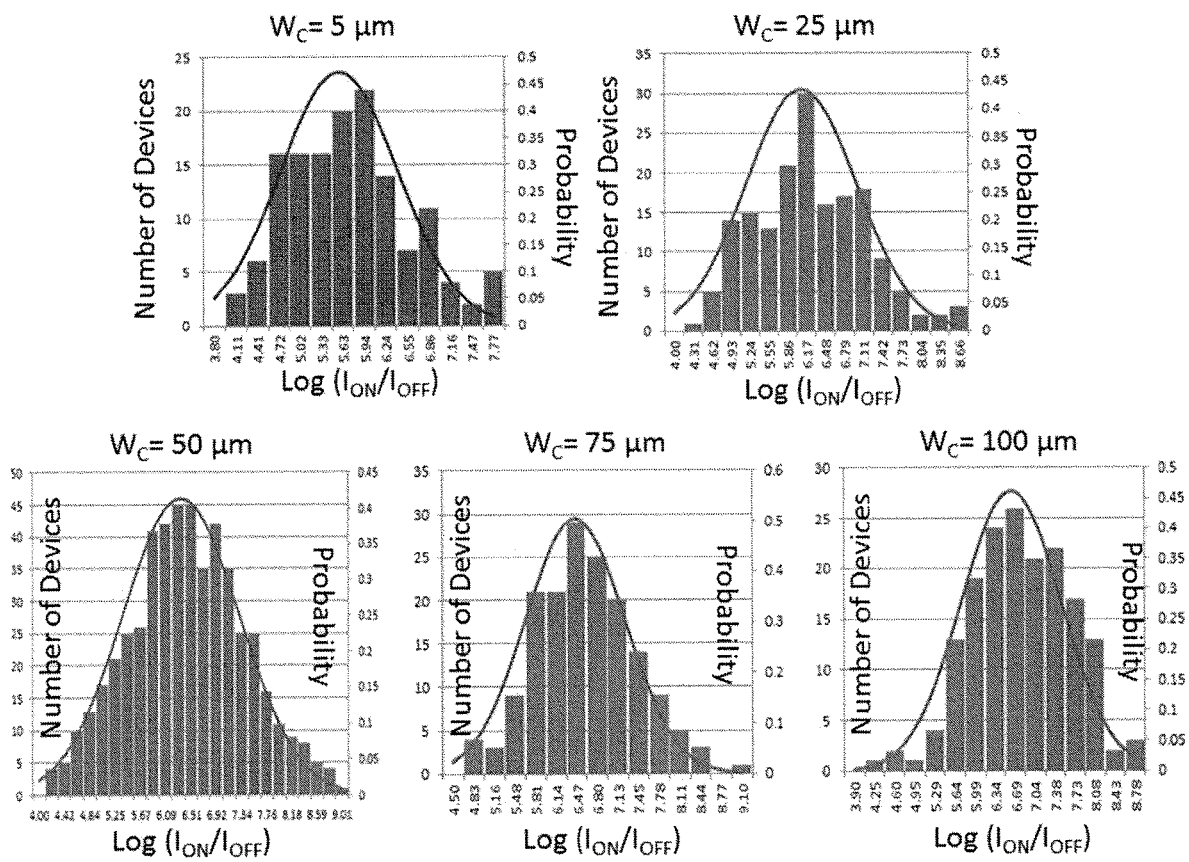
FIG. 7 is a series of histograms showing the statistical analysis of $I_{ON}/I_{OFF}$ ratio for NMOS (6,5) SWCNT TFTs with different channel widths, according to one or more embodiments.

The excellent uniformity demonstrates the reproducibility and consistency of the (6,5) SWCNT TFTs described herein, as well as the great advantage of single chirality SWCNTs. About 98% of 1440 unit devices were analyzed statistically, as shown in Table 1 and FIG. 7. The remaining 2% of the 1440 unit devices were not considered due to their defects. Their $I_{ON}/I_{OFF}$ ratio was plotted against $W_C/L_C$, as shown in FIG. 3G, showing repeatability and consistency among devices. The overall $I_{ON}/I_{OFF}$ is between 10$^6$ and 10$^7$ with less than 10% error bar. Significantly, the $I_{ON}/I_{OFF}$ ratio does not vary with the channel width (or the amount of (6,5) SWCNT), further illustrating the electronically pure semiconducting nature of the (6,5) SWCNTs. The variation of $I_{ON}/I_{OFF}$ ratio is within ±10%.

TABLE 1

Average threshold voltages of SiNx top-gated (6,5) SWCNT TFTs with different channel widths.

| | Channel (width:length) | | | | |
|---|---|---|---|---|---|
| | 5:5 | 25:5 | 50:5 | 75:5 | 100:5 |
| Average V$_{th}$ | 0.95 | 0.70 | 0.76 | 0.61 | 0.59 |
| # of valid data | 109 | 127 | 333 | 82 | 144 |

PMOS devices can be prepared using fabrication methods similar to those described above for NMOS devices. In preparing a p-type thin film transistor, hafnium oxide films can be used as the dielectric layer and can be deposited with atomic layer deposition, evaporation (e.g., electron beam evaporation), sputtering, and/or the like. In one embodiment, hafnium oxide films can be deposited using atomic layer deposition at temperatures lower than 225° C.

Figure 4A:
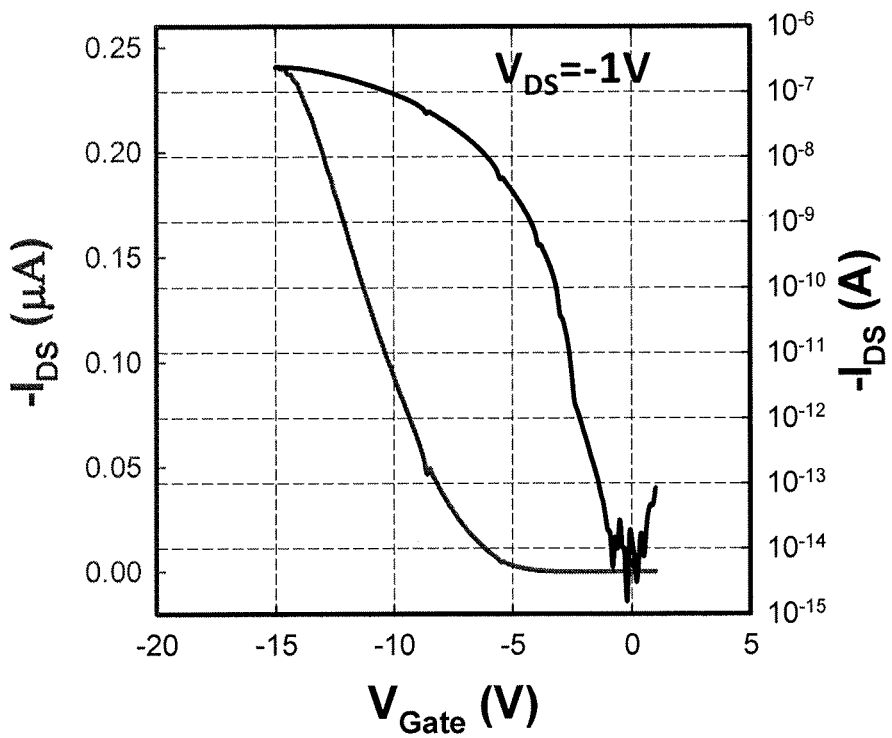
FIG. 4A is a plot showing the typical transfer characteristics of a $HfO_2$ top-gated (6,5) SWCNT TFT with a channel width of 50 μm showing fA-level off-current and >$10^8$ $I_{ON}/I_{OFF}$ ratio by sweeping $V_{Gate}$ from 0 V to −15 V (right $I_{DS}$ is log scale and left $I_{DS}$ is linear scale) under $V_{DS}$=−1 V.
Figure 4B:
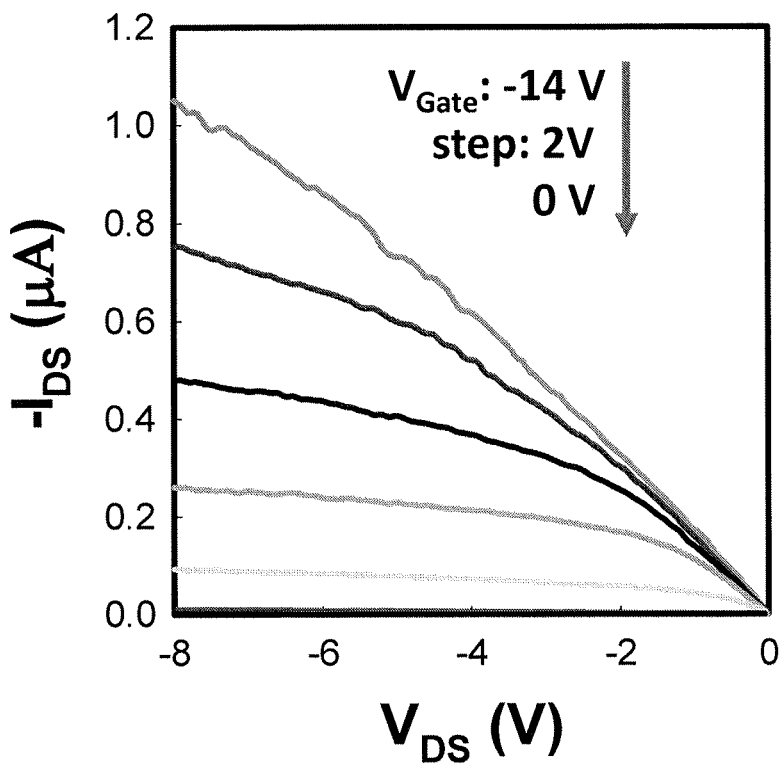
FIG. 4B is a plot showing the output characteristics of a $HfO_2$ top-gated (6,5) SWCNT TFT with a channel width of 50 μm showing downward bending curves by sweeping $V_{DS}$ from 0V to −8V; the curves moved down when $V_{Gate}$ switched from −14 V to −0 V with a step of 2V.

PMOS TFTs with (6,5) SWCNT thin films also were fabricated, by atomic layer deposition of 30 nm HfO$_2$ dielectrics on Borofloat33 Glass with Pd as electrodes. The device dimensions are same as those of NMOS TFTs. The typical transfer characteristics of the (6,5) SWCNT PMOS TFT with a channel width of 50 μm is shown in FIG. 4A. The current ($I_{DS}$) of the PMOS device increased from <10 fA to 0.24 μA when the $V_{Gate}$ was swept from 1 V to −15 V. The fA off current and $I_{ON}/I_{OFF}$>10$^8$ represented the best performance of the p-type SWCNT TFTs, and were superior even to low-temperature polycrystalline silicon TFTs. The output characteristics of the (6,5) SWCNT PMOS TFT is exhibited in FIG. 4B with swept $V_{DS}$ from 0 V to −8 V. The downward bending curves moved down when $V_{Gate}$ went down from −14 V to 0V. The saturated on-current was observed under $V_{Gate}$<8V. It is worthy to note that there is a fundamental problem for amorphous silicon, low-temperature polycrystalline silicone and metal oxides to be modulated by high-κ dielectrics due to carrier scattering induced degradation of electrical properties. Devices employing the e-CNTs described herein can be used to produced superior-performing alternative devices for use with high-κ dielectric materials.

Figure 11:
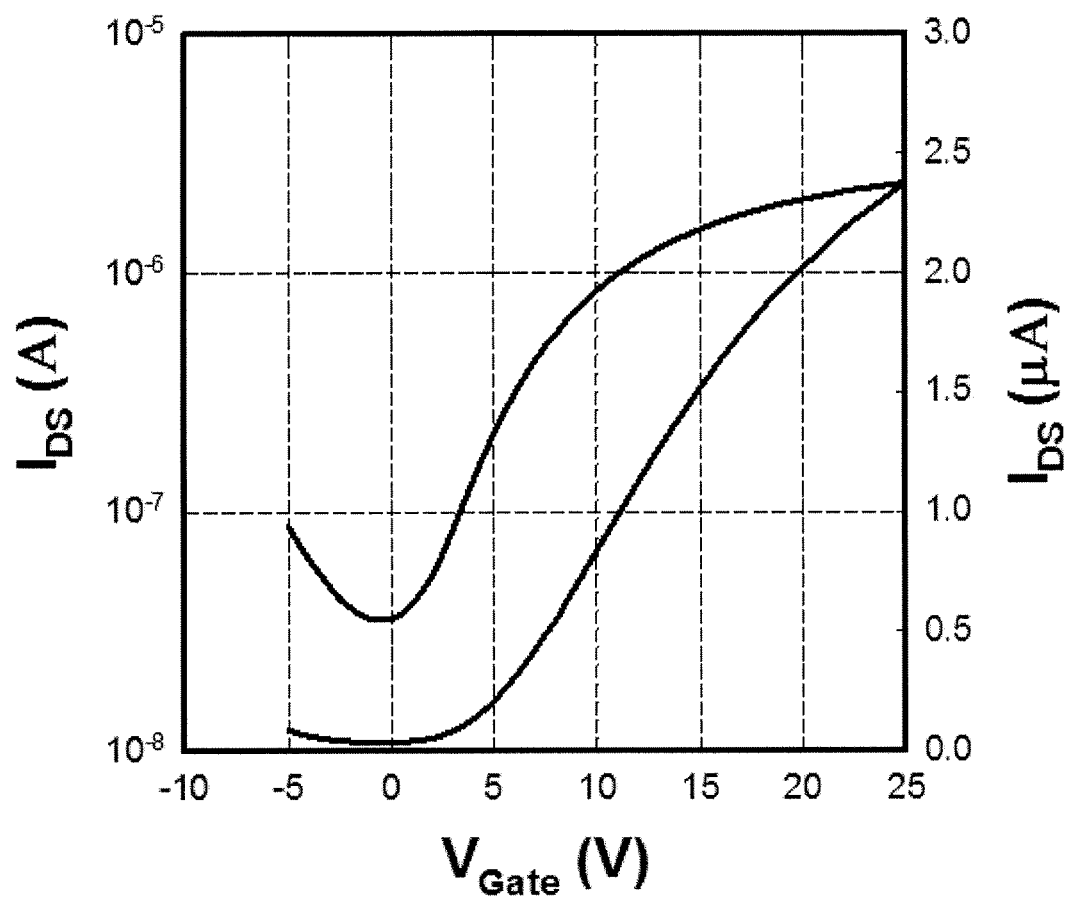
FIG. 11 is a plot of the typical transfer characteristics of SiNx top-gated Nanointegris 99% semiconducting SWCNT (IsoNanotubes-S 99% semiconducting) TFT with channel width of 50 μm by sweeping $V_{Gate}$ from −5 V to 20 V (right $I_{DS}$ is linear scale and left $I_{DS}$ is log scale) under $V_{DS}$=0.1 V.
Figure 12:
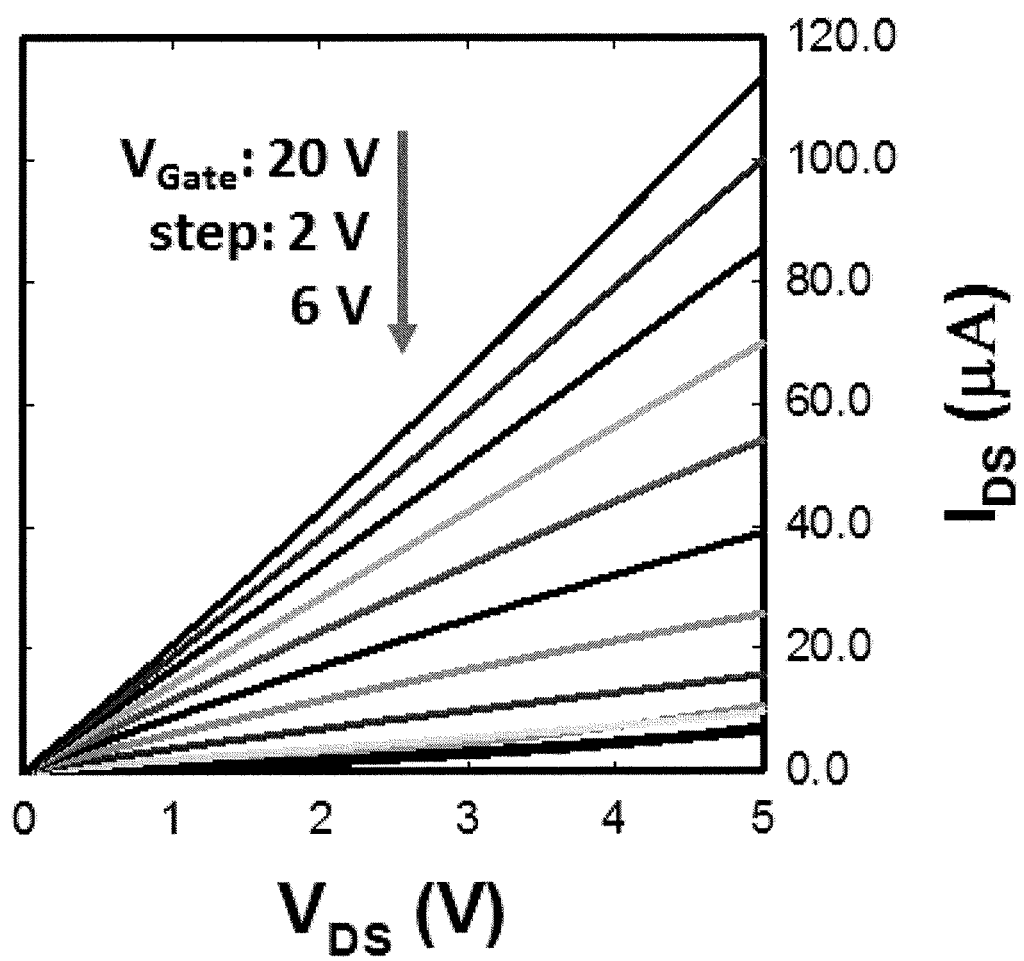
FIG. 12 is a plot of the output characteristics of SiNx top-gated (6,5) SWCNT TFT using Nanointegris 99% semiconducting SWCNT (IsoNanotubes-S 99% semiconducting) with channel width of 50 μm showing downward bending curves by sweeping VDS from 0V to 5V.

The low off-current and high $I_{ON}/I_{OFF}$ ratio of SWCNT thin film transistor using the e-SWCNTs of the current invention are compared to the transfer characteristics of thin film transistor devices using other conventional semiconducting SWCNTs. FIG. 11 is a plot of the typical transfer characteristics of SiNx top-gated Nanointegris 99% semiconducting SWCNT (IsoNanotubes-S 99% semiconducting) TFT with channel width of 50 μm by sweeping $V_{Gate}$ from −5 V to 20 V (right $I_{DS}$ is linear scale and left $I_{DS}$ is log scale) under $V_{DS}=0.1$ V. Similarly, output (B, D, F) characteristics of top-gated (6,5) SWCNT TFTs with SiNx dielectrics were determined. FIG. 12 shows the output characteristics of SiNx top-gated (6,5) SWCNT TFT using Nanointegris 99% semiconducting SWCNT (IsoNanotubes-S 99% semiconducting) with channel width of 50 μm and showing downward bending curves by sweeping VDS from 0V to 5V. The current e-SWCNTs have significantly better transfer characteristics than top-gated (6,5) SWCNT TFTs with SiNx dielectrics using the comparative 'pure' semiconductor carbon nanotubes, which showed only a 60 nA off-current, an $I_{ON}/I_{OFF}$ ratio of about 100, and an electron mobility of 70.77 cm$^2$/(V s).

In one or more embodiments, a test is provided for assessing whether single-walled carbon nanotube thin film transistors fabricated with top-gated SiNx demonstrate properties of amorphous silicon TFTs. A top-gated SiNx transistor is prepared by using a test SWCNT ink as the semiconductor layer. By way of example, a single-walled carbon nanotube thin film transistor can be fabricated using the method set out in the example section below. These devices are characterized using a semiconductor characterization system, such a Keithley 4200 SCS on SemiProbe PS4L M12 probe station (or other comparable system). The transfer characteristics of devices are obtained by sweeping the gate voltage $V_G$ at a rate of ~0.5 V/s. The source-to-drain voltages are kept constant at settled voltage. The output characteristics of the devices then are acquired by sweeping the source-to-drain voltage from 0 to 5 V at a rate of ~0.1 V/s. The gate voltage was kept constant from 20 V to ~4 V with interval of 2 V. The off currents and $I_{ON}/I_{OFF}$ ratio are determined from the output. Test devices demonstrating low off currents, e.g., on the order of fA, and a high $I_{ON}/I_{OFF}$ ratio, e.g., >10$^8$ $I_{ON}/I_{OFF}$ ratio, are deemed to be top-gated single-walled carbon nanotube thin film transistors, according to one or more embodiments of the invention. Off currents can be in the range of 10$^{-15}$-10$^{-12}$ A and $I_{ON}/I_{OFF}$ ratios can be in the range of 10$^6$-10$^{12}$.

With the performance characteristics of SiNx modulated (6,5) SWCNT TFTs similar to amorphous silicon TFTs, the operation principal of amorphous silicon TFTs can be readily applied to (6,5) SWCNT TFTs. Before the channel was turned on, the large Schottky contact completely shut down the channel same as metal/(6,5) SWCNT/metal at a low voltage bias. After the channel was turned on but still under $V_T$, the electron was drawn to form a depletion layer between (6,5) SWCNT and dielectrics in proportion to the increase in $V_G$. But the current increased exponentially ($I_{DS}$∝expr(vs/K$_b$it), q is the charge of an electron, kB is Boltzmann constant, T is temperature), as the band bending increased. After the depletion region was completed where $V_T$ was defined ($V_S$>$V_T$), metal/(6,5) SWCNT became an Osmic contact and the current linearly increased with applied gate voltage ($I_{DS}=k_{n'}W/L(VGS-V_T-V_{DS}/2)V_DS$, $k_{n'}$ is constant with unit $A/V^2$, W is channel width, L is channel length). This is due to the further drawn electrons occupying the conductive band to form a conductive channel by increasing $V_{GS}$. This basic operation works similarly for $HfO_2$ modulated PMOS (6,5) SWCNT TFTs. Differently, negative $V_{GS}$ forced holes to enter into the depletion region. After the depletion region was completed ($V_{GS}>V_T$), the excess holes occupied the valence band to form a conductive channel.

Figure 5A:
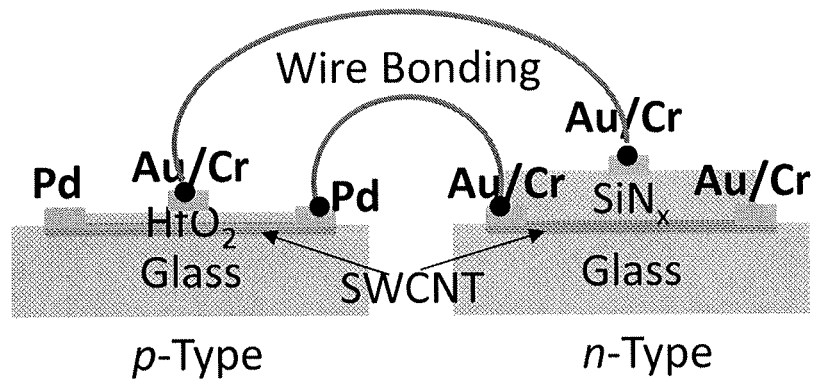
FIG. 5A is a schematic illustration of a CMOS inverter fabricated by wire bonding PMOS and NMOS (6,5) SWCNT TFTs.
Figure 5B:
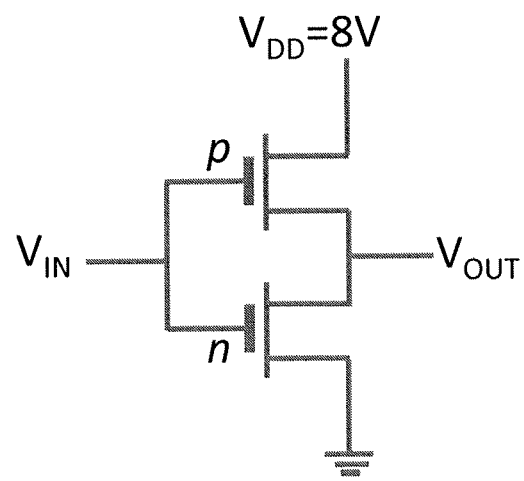
FIG. 5B is a circuit diagram of the CMOS (6,5) SWCNT inverter of FIG. 5A.
Figure 5C:
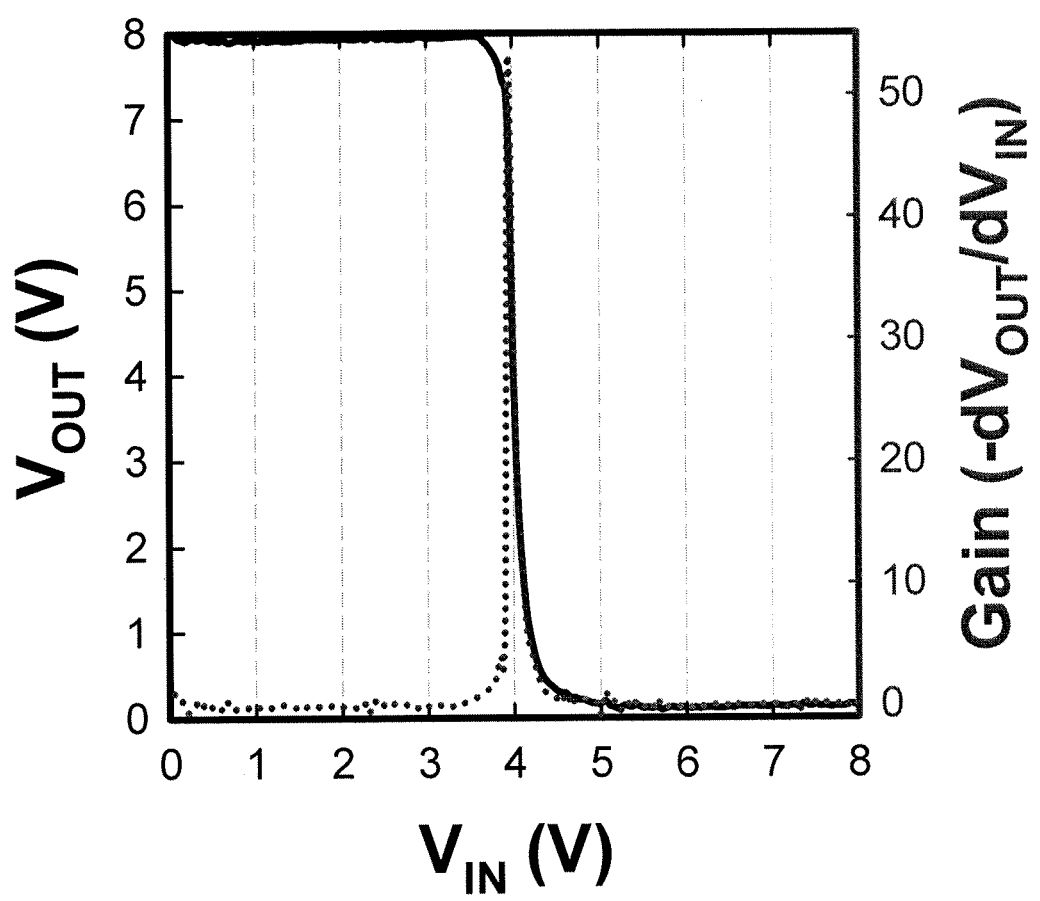
FIG. 5C is a plot showing the voltage transfer characteristics of a CMOS (6,5) SWCNT inverter showing a sharp inversion (solid curve) at $V_{IN}$=4 V and corresponding voltage gain as large as 52 (dot curve).

In one or more embodiments, a CMOS can be provided. The PMOS wafer was mounted on NMOS wafer, wire bonding was used to connect the gate electrode and one drain/source electrode of the PMOS (6,5) SWCNT TFT to those of the NMOS (6,5) SWCNT TFT, as shown in FIG. 5A. The completed CMOS circuit was characterized using a 4200 SCS under a Semiprobe PS4L M12 probe station in air at room temperature. As shown in the inverter diagram in FIG. 5B, a voltage supplier ($V_{DD}$=8V) was applied to the drain electrode of PMOS (6,5) SWCNT TFT and the source electrode of NMOS (6,5) SWCNT TFT was connected to the ground. When input voltage ($V_{IN}$) swept from 0 V to 8 V with an interval of 0.05 V, the measured output voltage remained high at 7.9 V before the sharp drop at 4V input voltage. After 4V input voltage, the output voltage remained a very low voltage at 0.1 V (FIG. 5C). By differentiating the $V_{OUT}$-$V_{IN}$ curve, a voltage gain as large as 52 was obtained for (6,5) SWCNT CMOS inverter (dashed dot curve in FIG. 5C). This high voltage gain for carbon nanotube inverters is due to the high performance of the devices (fA off-current and >$10^8$ $I_{ON}/I_{OFF}$ ratio). By changing the photomask design used, PMOS and NMOS (6,5) SWCNT TFTs can be fabricated on a common substrate, arranged in either a coplanar (2D) configuration, or vertically overlapping together (3D). The interconnections between PMOS and NMOS (6,5) SWCNT TFTs can be achieved with via drilling to form logic circuits for macroelectronics applications with increasing function per area and less power dissipation.

The performance of both PMOS and NMOS (6,5) SWCNT TFTs can be further improved with increasing on-current by shortening channel length or widening channel width or increasing the density of SWCNT without the sacrifice of extremely low off current. From SEM images of current devices, the thickness of (6,5) SWCNT film is under 1 nm. The larger on current is accomplishable for TFTs with thicker (6,5) SWCNT film >10 nm. For electronically pure semiconducting SWCNT, the off current will not vary with the amount of SWCNT such as channel width or thickness. Thus, both mobilities and $I_{ON}/I_{OFF}$ ratios will be further improved with thick (6,5) SWCNT films. Statistically, the thick layer of (6,5) SWCNT film could eliminate device variation, especially with single chirality (6,5) SWCNT of uniform electrical properties. These confer (6,5) SWCNTs as the replacement of amorphous silicon (>100 nm), low temperature polycrystalline silicon (50 nm), and metal oxides (50 nm) for TFT backplanes to meet the needs for emerging display commercial markets such as transparent, flexible and wearable displays. Further, with SWCNT alignment technologies and high-κ dielectrics, extremely high on-current (6,5) SWCNT TFT can be achieved with narrow channel length for high speed and low power dissipation electronics. Electronically pure (6,5) SWCNTs can thus be practical for implementation into large-scale electronic applications.

Thin film e-SWCNT TFT devices in accordance with the present invention may have low operating voltages as low as about 5 V or less. TFTs may have low subthreshold slopes as low as about 600 mV/decade or less. e-SWCNT TFT devices TFT devices of the present invention provide an excellent balance of high on-state currents, low operating voltage, and high on/off ratios. In one embodiment, the TFT device operates at voltages of about 5 V or less with on/off ratios of about $10^6$ or greater. e-SWCNT TFT solution are superior semiconductor materials for the fabrication of semiconducting CNT network TFTs. Current densities are similar to those achieved at similar tube densities on amorphous silicon, indicating that e-SWCNT inks and related films are excellent semiconductor materials for TFTs fabricated by printing or other solution-based processes.

Experimental Details

Materials:

Single-walled carbon nanotubes raw powder was produced in a Rice University Mark III high pressure carbon monoxide reactor using less catalyst in a yield of 1 gram per hour.

In a 100 mL beaker, the mixture of 100 SWCNTs raw powder and 100 mL of 2% sodium dodecyl sulfate (SDS, 99+% pure) aqueous solution were dispersed into 1 mg/mL solution using an ultrasonic processor (Cole Parmer, 20 W) equipped with a 0.5-inch Ti flat tip for 20 hours under continuous water cooling. The residue catalyst, large nanotube bundles and other impurities were removed via ultracentrifugation using a Beckman TL-100 ultracentrifuge equipped with a TLS-55 rotor. The top 90% of the supernatant was collected as the starting solution for gel chromatography.

Gel chromatography purification of SWNTs was performed using in-house packed columns packed with allyl dextran-based gel beads following a similar protocol in the literature.7 Briefly, a 20 mL of supernatant SWCNT solution was loaded to a column packed with 6 mL gel. The unabsorbed SWNTs were washed off with 2% SDS solution and the adsorbed SWCNTs on the column were eluted using 5% SDS solution. The unabsorbed SWNTs were then load to the column and eluted in the same way for four times. Then the (6,5) enriched fractions from the elution was then subjected to fine purification by repeating gel chromatography 4-6 times using gradient SDS concentrations. Roughly about 50 mL of pure (6,5) SWCNT purple solution was collected in a concentration of 6 μg/mL within 1 day.

The 2% SDS dispersed (6,5) SWCNT solution (15 mL, 6 μg/mL) was converted into 5% sodium cholate (SC) dispersed (6,5) SWCNT solution (6 mL, 15 μg/mL).

Device Fabrication:

Substrates including Borofloat 33 glass (Diameter: 100 mm, Thickness: 500 μm), Silicon wafer (SiO2 thickness: 500 nm) and quartz were treated with UV Ozone Cleaner (Jelight Model 42) for 15 minutes. After poly(l-Lysine) aqueous solution (0.1 weight %) flew through the substrates, the substrates were extensively washed with de-ionized water. The substrates were blown dry and further have 5% SC dispersed (6,5) SWCNT solution (15 μg/mL) flow through. Then the substrate was cured on hotplate at 110° C. for 10 minutes and followed with extensively washing with de-ionized water. The substrates were blown dry and annealed in vacuum oven at 200° C. for 2 hours. Thus clean (6,5) SWCNT was uniformly coated in substrates. The size of substrates can be as large as 120 inch in diagonal for Gen10 manufacturing line.

Drain/Source electrodes were patterned with photolithography using AZ2020 photo resistance gel. Then 10 nm Cr (0.5 A/s rate, 16% power) and 40 nm (3 A/s rate, 22% power) were deposited in sequence using Sloan E-Beam, and lift-off using acetone. For Pd electrodes, 40 nm Pd (3 A/s rate, 22% power) was deposited using Sloan E-Beam, and lift-off using acetone.

The (6,5) SWCNT thin film was patterned with photolithography using AZ 5214 photo resistance gel. The unpatterned (6,5) SWCNT thin film was etched with $O_2$ plasma (100 sccm flow, 100 W) using Oxford RIE and then patterned photo resistances were stripped off using acetone immediately. The 170 nm SiNx was deposited with plasma enhanced chemical vapor deposition (225° C., N2 100 sccm, He 400 sccm, $NH_3$ 10 sccm, SiH4 5.3 sccm). The 30 nm $HfO_2$ was deposited with atomic layer deposition ($CH_3$-TEMAH-200-$H_2O$ at 200° C., 0.1 nm/cycle rate).

Gate electrodes were patterned with photolithography using AZ2020 photo resistance gel. Then 10 nm Cr (0.5 A/s rate, 16% power) and 90 nm (3 A/s rate, 22% power) were deposited in sequence using Sloan E-Beam, and lift-off using acetone. For Pd electrodes, 90 nm Pd (×3 A/s rate, 22% power) was deposited using Sloan E-Beam, and lift-off using acetone.

Drain/source pads were opened with photolithography using AZ 5214 photo resistance gel. The patterned SiNx or $HfO_2$ above drain/source pads were dry etched using Oxford RIE (3 sccm O2, 30 sccm CHF3).

Gold electrodes were aerosol jet printed using 4 nm gold nanoparticle in xylene (40 weight %) and cured at >200° C. for 30 minutes. Silver paste (SPI Chem ERL 4221 Epoxy Plasticizer) was used to bond copper wire (0.5 mm in diameter) on substrates.

Measurements:

The Vis-NIR absorption, NIR fluorescence emission (excited at 532 nm) and Raman spectroscopy (excited at 532 nm) of (6,5) SWCNT purple solution were measured on NS3 NanoSpectralyzer. SEM image of (6,5) SWCNT thin film was imaged with Stanford Nova NanoSEM. The current-bias curves, transfer characteristics, output characteristics and voltage output characteristic of Schottky diodes, NMOS and PMOS TFTs and CMOS inverters were measured with a Keithley 4200 SCS on SemiProbe PS4L M12 probe station. The transfer characteristics of devices were obtained by sweeping the gate voltage VG at a rate of ~0.5 V/s. The source-to-drain voltage was kept constant at settled voltage. The output characteristics of devices were acquired by sweeping the source-to-drain voltage from 0 to 5 V at a rate of ~0.1 V/s. The gate voltage was kept constant from 20 V 210 to −4 V with interval of 2 V. The current-bias curves of copper wire (0.5 mm in diameter) bonded Schottky diodes were tested with an Atlas DCA Pro analyzer/curve tracer from PEAK Instruments.

Preparation of E-CNT Thin Film Transistors Using Convention Semiconductor Fabrication Processes The fabrication steps used in the manufacture of a bottom-gated e-SWCNT TFTs is described. The process demonstrates that e-SWCNT TFTs can readily be integrated into conventional TFT fabrication processes.

Figure 13A:
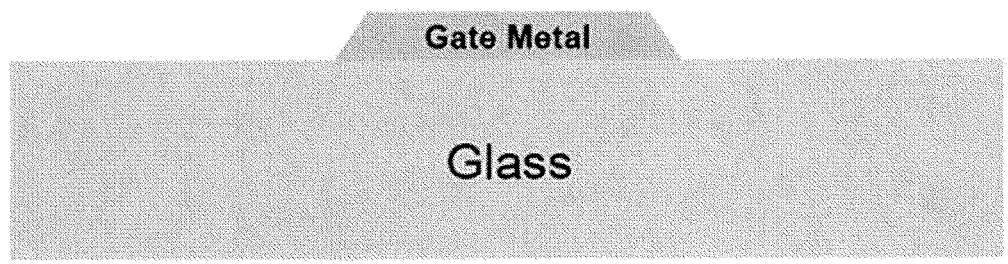
FIG. 13A-13D show a series of fabrication steps in the manufacture of bottom-gated e-SWCNT TFTs, according to one or more embodiments.
Figure 13B:
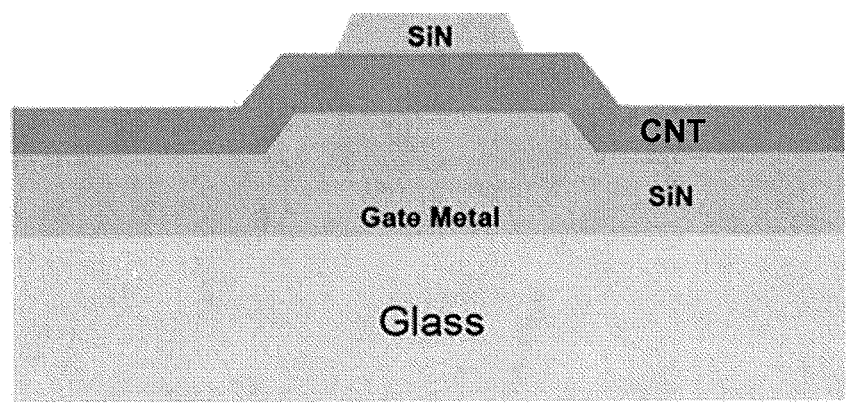
Figure 13C:
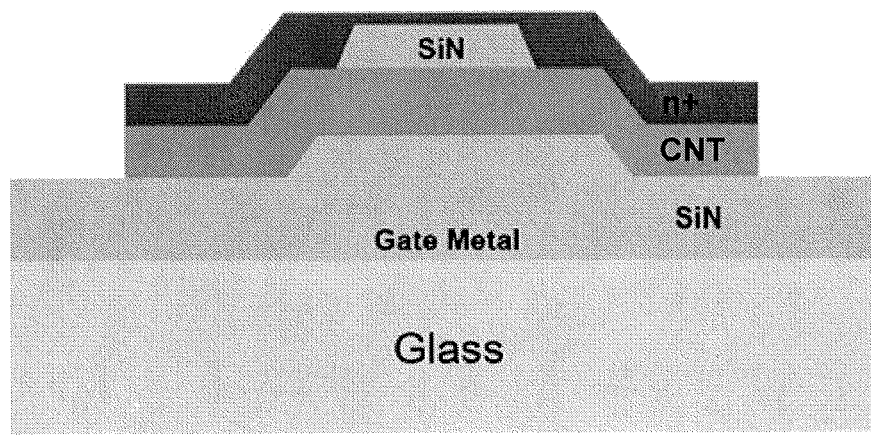
Figure 13D:
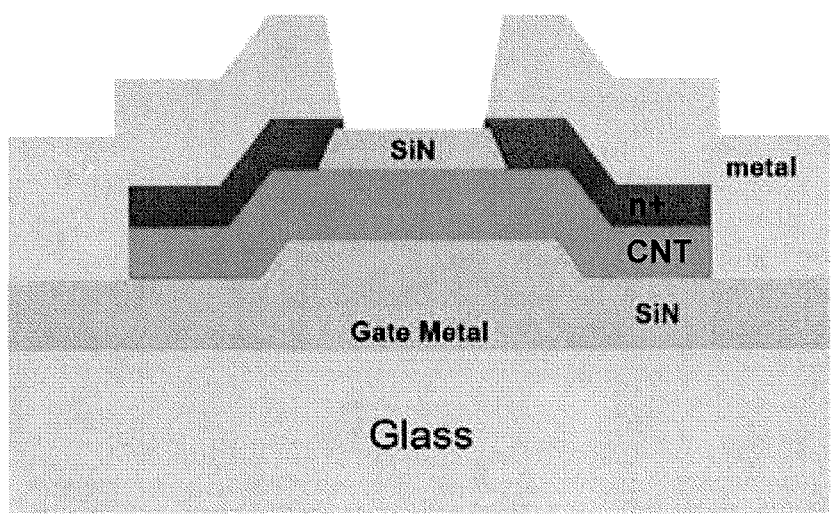

The fabrication of an e-SWCNT TFT is shown in FIGS. 13A-13D. FIG. 13A shows the deposition and definition of the metal gate (M1. FIG. 13B shows the sequential deposition of the SiN gate dielectric, a semiconducting layer of e-SWCNTs, and an SiN etch-stop layer. The SiN etch stop layer is etch backed to form an SiN etch stop pad (M2). The process is similar to that for conventional a-Si:H TFT, except that a SWCNT thin film layer is used instead. The SWCNT layer can be put down using spin coating or other liquid deposition method that is readily integratable into the conventional semiconductor fabrication line. Next, as shown in FIG. 13C, the n+ conductive layer is deposited and the TFT island is defined (M3). In FIG. 13D, a metal layer is deposited and defined to form the source and drain metal contacts, the n+ conductive material is removed to expose the SiN etch stop (M4), and a final passivation layer is deposited and a contact window opening is formed to the source, drain and gate metal contacts (M5).

In the Etch-Stop process, the contact window is formed by etching back to the SiN etch stop pad. FIG. 14 shows a cross-sectional view of an e-SWCNT TFT and processing modules of the Etch-Stop process used in making the final device architecture.

An alternative process includes formation of e-SWCNT TFT using Back Channel Etch (BCE) processing. As shown in FIG. 15, the contact window is formed by etching back to the underlying SWCNT layer. FIG. 15 shows a cross-sectional view of an e-SWCNT TFT and the Back Channel Etch (BCE) processing modules used in making the final device architecture. The process flow can be readily integrated into existing semiconductor fabrication processes.

The e-CNT inks and e-CNT thin films can be used in conventional devices, with minimal modification of existing fabrication methods. The performances of both top-gated and bottom-gated single chirality SWCNT thin film transistors (TFTs) are consistent and reproducible, remarkably different from those constructed on optically pure semiconducting SWCNTs. The stable and invariant device performances of e-SWCNT can be plausibly ascribed to their uniform diameter and chirality. TFT resembled fabrication processes compatible with conventional amorphous silicon TFT fabrication and performance characteristics of $SiN_x$ top-gated and bottom gated e-SWCNT TFTs demonstrate the feasibility of producing high performance SWCNT TFT backplanes in existing amorphous Si manufacturing lines. E-SWCNT are compatible with high κ dielectrics used in ultrafast electronics, making electronically pure single chirality semiconducting SWCNT ink practical for applications in large scale electronics.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%) can be understood as being within the scope of the description; likewise, if a particular shape is referenced, the shape is intended to include imperfect variations from ideal shapes, e.g., due to manufacturing tolerances. Percentages or concentrations expressed herein can represent either by weight or by volume.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise.

It will be appreciated that while a particular sequence of steps has been shown and described for purposes of explanation, the sequence may be varied in certain respects, or the steps may be combined, while still obtaining the desired configuration. Additionally, modifications to the disclosed embodiment and the invention as claimed are possible and within the scope of this disclosed invention.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

What is claimed is:

1. An electronically pure carbon nanotube ink, comprising:
   a population of single-walled semiconducting carbon nanotubes suspended in a liquid, the ink being essentially free of metallic impurities and wherein the ink is characterized as being electronically pure when incorporated as a carbon nanotube network in a metal/carbon nanotube network/metal double diode, by obtaining a nonlinear current-bias curve through the application of a potential from 0.01 V to 5 V across the semiconducting carbon nanotube network diode.

2. The electronically pure carbon nanotube ink of claim 1, wherein 99.9% or more of the carbon nanotubes are semiconducting.

3. The electronically pure carbon nanotube ink of claim 1, wherein 99.99% or more of the carbon nanotubes are semiconducting.

4. The electronically pure carbon nanotube ink of claim 1, wherein the carbon nanotubes comprise one or more chiralities selected from (6,1), (5,3), (7,0), (6,2), (5,4), (8,0), (7,2), (8,1), (6,4), (7,3), (6,5), (9,1), (8,3), (10,0), (9,2), (7,5), (8,4), (11,0), (12, 2), (7,6), (9,4), (11,1), (10,3), (8,6), (9,5), (12,1), (11,3), (8,7), (13,0), (12,2), (10,5), (11,4), (9,7), (10,6), (13,2), (12,4), (14,1), (9,8), (13,3), (18,4), (20,2).

5. The electronically pure carbon nanotube ink of claim 1, wherein the semiconducting carbon nanotubes are of a single chirality.

6. The electronically pure carbon nanotube ink of claim 4, wherein the carbon nanotubes are (6,5) single-walled carbon nanotube.

7. The electronically pure carbon nanotube ink of claim 1, wherein the semiconducting carbon nanotubes are a single tube diameter of 0.7 nm and length from 500 nm to 10 µm.

8. The electronically pure carbon nanotube ink of claim 1, wherein the liquid comprises deionized water.

9. The electronically pure carbon nanotube ink of claim 1, wherein the ink comprises water soluble surfactants.

10. The electronically pure carbon nanotube ink of claim 9, wherein the water soluble surfactants are selected from the group of are sodium dodecyl sulfate, sodium dodecylbenzene sulfate, sodium cholate, and sodium deoxycholate.

11. An electronically pure carbon nanotube thin film, comprising:
    a population of single-walled semiconducting carbon nanotubes essentially free of metallic impurities and organic material, and wherein the film is characterized as being electronically pure when incorporated as a carbon nanotube network in a metal/carbon nanotube network/metal double diode, by obtaining a nonlinear current-bias curve through the application of a potential from 0.01 V to 5 V across the semiconducting carbon nanotube network diode.

12. The electronically pure carbon nanotube thin film of claim 11, wherein 99.9% or more of the carbon nanotubes are semiconducting.

13. The electronically pure carbon nanotube thin film of claim 11, wherein 99.99% or more of the carbon nanotubes are semiconducting.

14. The electronically pure carbon nanotube thin film of claim 11, wherein the carbon nanotubes comprise one or more chiralities selected from (6,1), (5,3), (7,0), (6,2), (5,4), (8,0), (7,2), (8,1), (6,4), (7,3), (6,5), (9,1), (8,3), (10,0), (9,2), (7,5), (8,4), (11,0), (12, 2), (7,6), (9,4), (11,1), (10,3), (8,6), (9,5), (12,1), (11,3), (8,7), (13,0), (12,2), (10,5), (11,4), (9,7), (10,6), (13,2), (12,4), (14,1), (9,8), (13,3), (18,4), (20,2).

15. The electronically pure carbon nanotube thin film of claim 14, wherein the semiconducting carbon nanotubes are a single chirality.

16. The electronically pure carbon nanotube thin film of claim 14, wherein the carbon nanotubes are (6,5) single-walled carbon nanotube.

17. The electronically pure carbon nanotube thin film of claim 11, wherein the semiconducting carbon nanotubes are a single tube diameter of 0.7 nm and length from 500 nm to 5 µm.

18. The electronically pure carbon nanotube thin film of claim 11, wherein the carbon nanotube density is in a range from 1-1000 nanotubes per µm$^2$.

19. A method of identifying an electronically pure carbon nanotube ink, comprising:
    providing a nanotube ink of interest;
    preparing a metal electrode/carbon nanotube network/metal electrode double diode, using the carbon nanotube ink of interest;
    applying a voltage from 0.01 V to 5 V across the carbon nanotube network diode; and
    generating a current-bias curve, wherein a non-linear curve generated by the carbon nanotube network diode is an indication of an electronically pure semiconducting carbon nanotube ink.

20. The method of claim 19, wherein the nonlinear curve exhibits a power-law behavior.

21. The method of claim 19, wherein a curve is considered non-linear when the correlation coefficient in a linear regression analysis is less than 0.90.

22. The method of claim 19, wherein a curve is considered non-linear when the correlation coefficient in a linear regression analysis is less than 0.80.

23. The method of claim 19, wherein the electrodes are prepared from metals selected from Au, Cr, Ag, Ti, Cu, Al, Mo, Pd, Pt, Sc, and/or their combination.

24. The method of claim 19, wherein the electrodes define a channel length in the range of 5 nm to >1 mm and a channel width in the range of 5 nm to >1 mm.

25. A method of making an electronically pure carbon nanotube thin film comprising:
   treating a substrate by ozone, and coating with poly(I-Lysine); and
   applying the electronically pure semiconducting carbon nanotube ink of claim 1 on the poly(I-Lysine) treated substrate.

\* \* \* \* \*